(12) United States Patent
Mueller et al.

(10) Patent No.: US 8,716,984 B2
(45) Date of Patent: May 6, 2014

(54) METHOD AND APPARATUS FOR MODIFYING THE SENSITIVITY OF AN ELECTRICAL GENERATOR TO A NONLINEAR LOAD

(75) Inventors: Michael Mueller, Fort Collins, CO (US); Michael Lynn Westra, Windsor, CO (US); Jeremy Richardson, Fort Collins, CO (US); Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 439 days.

(21) Appl. No.: 13/214,165

(22) Filed: Aug. 20, 2011

(65) Prior Publication Data

US 2012/0218042 A1 Aug. 30, 2012

Related U.S. Application Data

(63) Continuation-in-part of application No. 12/494,026, filed on Jun. 29, 2009, now Pat. No. 8,004,251.

(60) Provisional application No. 61/476,633, filed on Apr. 18, 2011.

(51) Int. Cl.
*H02P 9/00* (2006.01)
(52) U.S. Cl.
USPC .......................................................... 322/36
(58) Field of Classification Search
USPC .............................................. 322/24, 36, 37
See application file for complete search history.

(56) References Cited

U.S. PATENT DOCUMENTS

| 4,160,397 | A | 7/1979 | Bertini |
| 4,387,777 | A | 6/1983 | Ash |
| 4,462,942 | A | 7/1984 | Hamill et al. |
| 4,463,306 | A | 7/1984 | de Mello et al. |
| 4,478,130 | A | 10/1984 | Brenner et al. |
| 4,496,899 | A | 1/1985 | Lippitt et al. |
| 4,614,060 | A | 9/1986 | Dumenil et al. |
| 4,704,443 | A | 11/1987 | Lamont |
| 4,716,441 | A | 12/1987 | Ogawa |

(Continued)

FOREIGN PATENT DOCUMENTS

| JP | 03-222508 | 1/1991 |
| JP | 2003-8365 A | 1/2003 |
| WO | 2004054096 A1 | 6/2004 |
| WO | 2012145215 A1 | 10/2012 |

OTHER PUBLICATIONS

Yasui, Masashi, Office Action re Japanese Patent Application No. 2010-506447, Aug. 2, 2012, p. 8 Published in: JP.

(Continued)

*Primary Examiner* — Nicholas Ponomarenko
(74) *Attorney, Agent, or Firm* — Neugeboren O'Dowd PC

(57) ABSTRACT

A method and generator for modifying interactions between a load and the generator are described. The method includes applying output power to the load using a power amplifier, controlling a level of the output power responsive to a power control setting, and adjusting a conduction angle of the power amplifier to reduce a level of sensitivity of the power amplifier to variations of an impedance of the load. The generator includes a compensation subsystem coupled to the power amplifier that controls a conduction angle of the power amplifier to enable a sensitivity of the power amplifier to be adjusted.

25 Claims, 25 Drawing Sheets

(56) References Cited

U.S. PATENT DOCUMENTS

| | | |
|---|---|---|
| 4,770,097 A | 9/1988 | Wilson et al. |
| 4,779,924 A | 10/1988 | Rudel |
| 5,483,147 A | 1/1996 | Ilic et al. |
| 5,576,629 A | 11/1996 | Turner et al. |
| 5,672,949 A | 9/1997 | Ward |
| 5,710,492 A | 1/1998 | Konishi et al. |
| 5,747,935 A | 5/1998 | Porter et al. |
| 5,817,093 A | 10/1998 | Williamson, IV et al. |
| 5,827,435 A | 10/1998 | Samukawa |
| 5,859,501 A | 1/1999 | Chi |
| 5,977,737 A | 11/1999 | Labriola, II |
| 5,985,375 A | 11/1999 | Donohoe et al. |
| 6,009,828 A | 1/2000 | Tomita et al. |
| 6,030,667 A | 2/2000 | Nakagawa et al. |
| 6,045,877 A | 4/2000 | Gleason et al. |
| 6,046,546 A | 4/2000 | Porter et al. |
| 6,054,063 A | 4/2000 | Ohtake et al. |
| 6,187,685 B1 | 2/2001 | Hopkins et al. |
| 6,214,162 B1 | 4/2001 | Koshimizu |
| 6,218,196 B1 | 4/2001 | Ise et al. |
| 6,312,556 B1 | 11/2001 | Donohoe et al. |
| 6,362,690 B1 | 3/2002 | Tichauer |
| 6,372,654 B1 | 4/2002 | Tokashiki |
| 6,391,659 B1 | 5/2002 | Kwon et al. |
| 6,416,822 B1 | 7/2002 | Chiang et al. |
| 6,426,302 B2 | 7/2002 | Kitagawa |
| 6,432,834 B1 | 8/2002 | Kim |
| 6,459,066 B1 | 10/2002 | Khater et al. |
| 6,459,067 B1 | 10/2002 | Vona, Jr. et al. |
| 6,696,820 B2 | 2/2004 | Peter |
| 6,703,080 B2 | 3/2004 | Reyzelman et al. |
| 7,570,028 B2 * | 8/2009 | van Zyl .......................... 322/36 |
| 8,004,251 B2 * | 8/2011 | van Zyl .......................... 322/36 |
| 2010/0168932 A1 * | 7/2010 | Van Zyl ........................ 700/295 |

OTHER PUBLICATIONS

Yamamoto, Shusaku, Response to Office Action dated Aug. 2, 2012 re Japanese Patent Application No. 2010-506447, Dec. 11, 2012, p. 8.
KIPO, Office Action re Korean Patent Application No. 10-2009-7022972, Mar. 30, 2012, p. 11 Published in: KR.
KIPO, Office Action re Korean Patent Application No. 10-2009-7022972, Nov. 29, 2012, p. 2 Published in: KR.
Young, Lee W., International Search Report re Application No. PCT/US08/61232, Sep. 10, 2008, Published in: PCT.
Dixit, Arpit, International Search Report re Application No. PCT/US12/33198, Jul. 3, 2012, Published in: AU.
Whitman-Regis, Agnes, International Preliminary Report on Patentability re Application No. PCT/US08/61232, Nov. 5, 2009, Published in: CH.
Moon, Kihwan, "International Preliminary Report on Patentability re Application No. PCT/US2012/033198", Oct. 31, 2013, p. 6 Published in: CH.

* cited by examiner

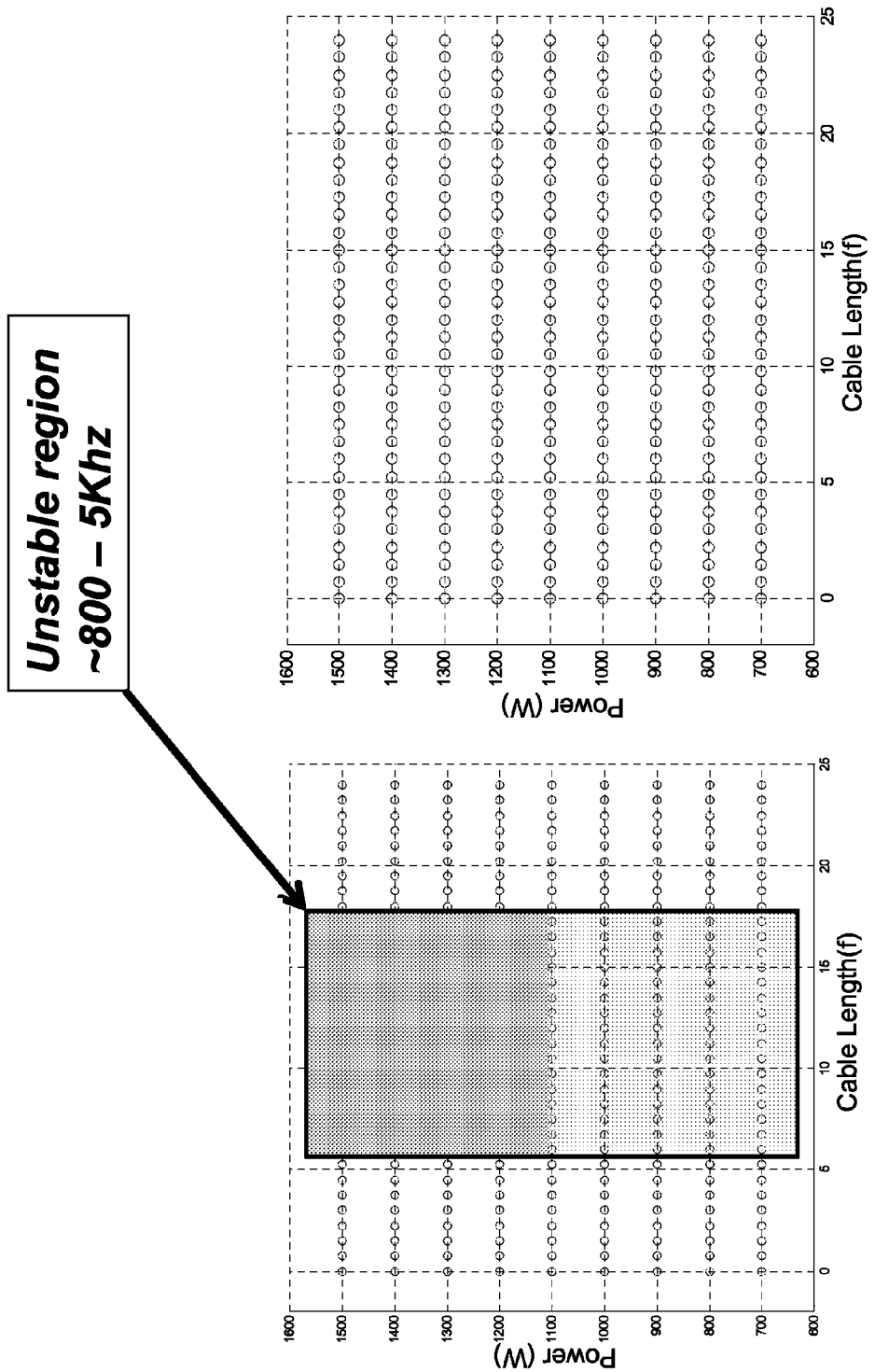

METHOD AND APPARATUS FOR MODIFYING THE SENSITIVITY OF AN ELECTRICAL GENERATOR TO A NONLINEAR LOAD

FIELD OF THE INVENTION

The present invention relates generally to electrical generators. In particular, but not by way of limitation, the present invention relates to methods and apparatuses for modifying interactions between an electrical generator and a nonlinear load.

BACKGROUND OF THE INVENTION

In some applications, it is advantageous to use an electrical generator with a source impedance that is very different from the source impedance that would result in maximum power delivery to the load. For example, in the context of radio-frequency (RF) generators, the source impedance is often very different from the complex conjugate of the load impedance. In terms of a Smith chart (reflection coefficient chart, Philip H. Smith, 1939), the source impedance in such generators is toward the edge of a chart normalized to the load impedance (e.g., 50 ohms for standard RF applications). Some radio-frequency (RF) generators are designed with such a source impedance to render the generator less expensive and bulky than one having a resistive source impedance (e.g., 50 ohms).

One disadvantage of such a design, however, is that the generator is much more sensitive to variations in load impedance when the load impedance is close to the nominal load impedance (e.g., 50 ohms) into which the generator is designed to operate than a generator having a resistive source impedance that is matched to the load impedance. A particular difficulty in such systems when operated into a nonlinear load such as a plasma is that a change in generator output power can result in a change in load impedance, and a change in load impedance can result in a change in generator output power. In some situations, the generator and the nonlinear load may interact in a manner that results in instability of the output power.

It is thus apparent that there is a need in the art for an improved method and apparatus for modifying interactions between an electrical generator and a nonlinear load.

SUMMARY OF THE INVENTION

Illustrative embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

In several embodiments, the present invention may be characterized as a generator that includes a power amplifier configured to apply output power to a load responsive to a power control signal and a reference signal, a power control system in this embodiment is coupled to the power amplifier that adjusts the power control signal based upon a power set point and the output power, and a compensation subsystem is coupled to the power amplifier that controls a conduction angle of the power amplifier to enable a sensitivity of the power amplifier to be adjusted.

In accordance with several aspects of the present invention, the invention may be characterized as a method for reducing a sensitivity of a generator to variations in impedance of a load. The method includes applying output power to the load using a power amplifier, controlling a level of the output power responsive to a power control setting, and adjusting a conduction angle of the power amplifier to reduce a level of sensitivity of the power amplifier to variations of an impedance of the load.

These and other embodiments are described in further detail herein.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings, wherein:

FIGS. 22A and 22B show the stability of a plasma system as a function of cable length installed between the generator and the impedance matching network attached to the plasma chamber with FIG. 22A showing the existence of an unstable region in the case of a typical generator and FIG. 22B showing stable operation for all cable lengths for a generator implemented according to embodiments of the present invention.

DETAILED DESCRIPTION

Figure 1A:
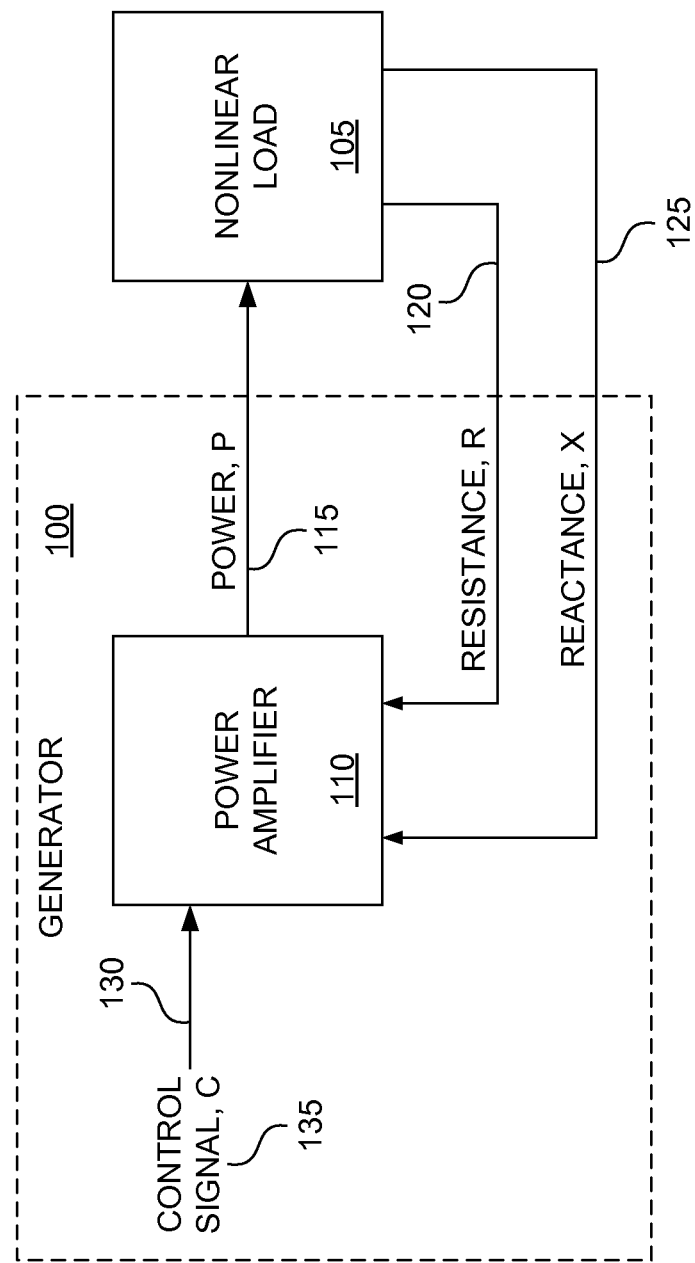
FIG. 1A is a block diagram of a generator connected with a nonlinear load to facilitate an analysis of the stability of the generator.

An understanding of various embodiments of the invention is aided by an analysis of how instability in the output power of an electrical generator can occur as a result of interactions between the generator and the impedance of a nonlinear load with which it is connected. FIG. 1A is a block diagram of a generator 100 connected with a nonlinear load 105 to facilitate such an analysis. Generator 100 includes a power amplifier 110, which delivers output power P 115 to the nonlinear load 105. Nonlinear load 105 in turn presents an impedance Z to power amplifier 110, the real and imaginary components of which are, respectively, resistance R 120 and reactance X 125. That is, Z=R+jX.

Power amplifier 110 includes a control input 130 that receives a control signal C 135. Control signal 135 is used to control the output power 115 produced by power amplifier 110. Control signal 135 is produced by a main power control loop (not shown in FIG. 1A).

Assuming that changes in generator output power 115 in response to a change in impedance of the nonlinear load 105 occur instantaneously and, similarly, that changes in the impedance of nonlinear load 105 occur instantaneously when the output power 115 into nonlinear load 105 is changed, the system shown in FIG. 1A can be modeled by the following three equations:

$$P = f(C,R,X)$$

$$R = g(P)$$

$$X = h(P).$$

Assuming these functions are differentiable and using a Taylor series expansion with only the first derivative, they can be linearized around the operating point to obtain $$\frac{dP}{dC} = \frac{1}{1 - \frac{\partial f}{\partial R}\frac{dg}{dP} - \frac{\partial f}{\partial X}\frac{dh}{dP}}\frac{\partial f}{\partial C} = \frac{1}{1 - \left(\frac{dP}{dZ}, \frac{dZ}{dP}\right)}\frac{\partial f}{\partial C}, \quad \text{(Equation 1)}$$

where $$\left(\frac{dP}{dZ}, \frac{dZ}{dP}\right)$$

is the inner product of the vectors $$\frac{dP}{dZ} = \frac{f}{R}, \frac{f}{X} \div \text{ and } \frac{dZ}{dP} = \left(\frac{dg}{dP}, \frac{dh}{dP}\right).$$

The first of these vectors models the sensitivity of the generator 100 to changes in the impedance of nonlinear load 105, and the second vector models the sensitivity of the impedance of nonlinear load 105 to changes in generator power 115.

As long as the above inner product is less than 1, a drop in the gain of the main power control loop of generator 100 can compensate for the increase in gain of the output power 115 with respect to the control signal 135. However, when the above inner product is greater than 1, the sign of the transfer function from the control signal 135 to the output power 115 is reversed, and no modification of the gain of the generator's main power control loop can restore stability. In an unstable condition, generator 100 does not produce a constant output power 115 as desired.

Figure 1B:
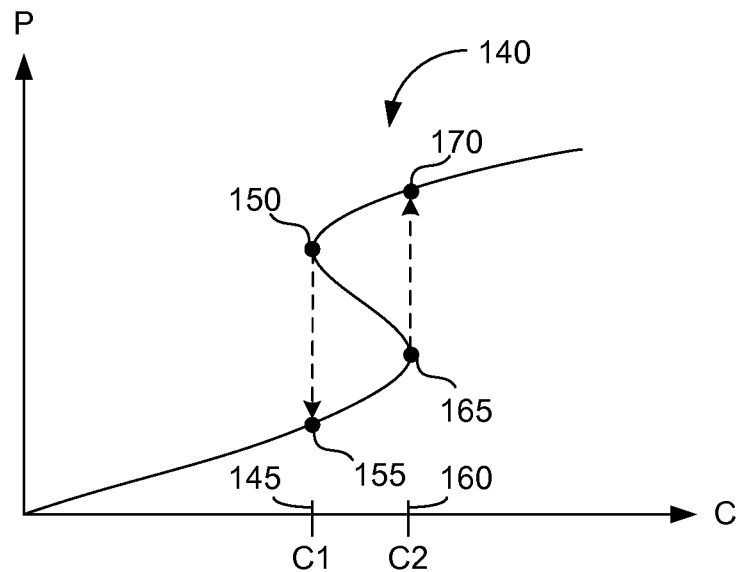
FIG. 1B is a graph of the output power P of the generator shown in FIG. 1A as a function of generator control signal C in a situation in which P is unstable.

The instability that can result due to interactions between generator 100 and nonlinear load 105 is illustrated in FIG. 1B. FIG. 1B is a graph 140 of the output power P 115 of generator 100 as a function of control signal C 135 in a situation in which P is unstable. Notice that graph 140 is not one-to-one (i.e., it is a relation but not a function). That is, there are multiple values of P for some values of C. With a control signal 135 of $C_1$ (145), P is initially at point 150, but P subsequently drops to point 155. Compensating for the drop in output power 115 by changing control signal 135 to $C_2$ (160) initially produces P at point 165, but P subsequently jumps up to point 170. The transition from point 150 to 155 or from point 165 to point 170 can occur in as little as 2-3 µs in some applications.

Figure 1C:
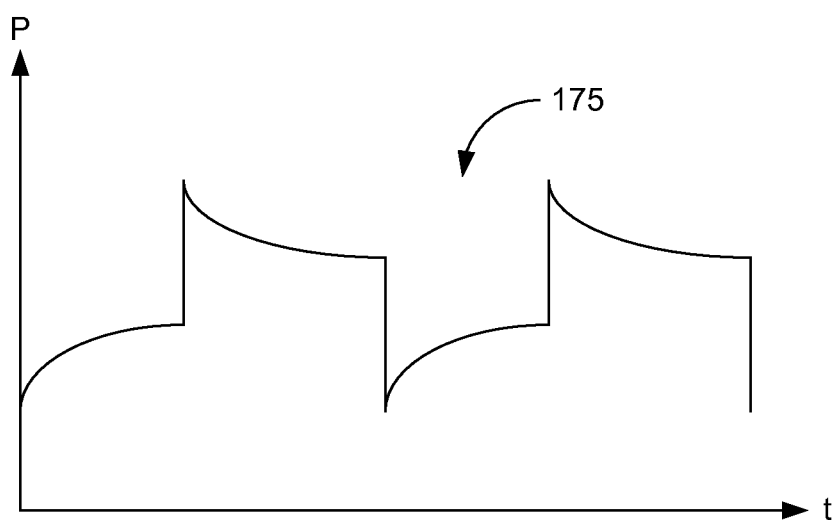
FIG. 1C is a graph of the output power P of the generator shown in FIG. 1A as a function of time in the same situation as in FIG. 1B.

The resulting output power 115 of generator 100 as a function of time is sketched as graph 175 in FIG. 1C.

Figure 2A:
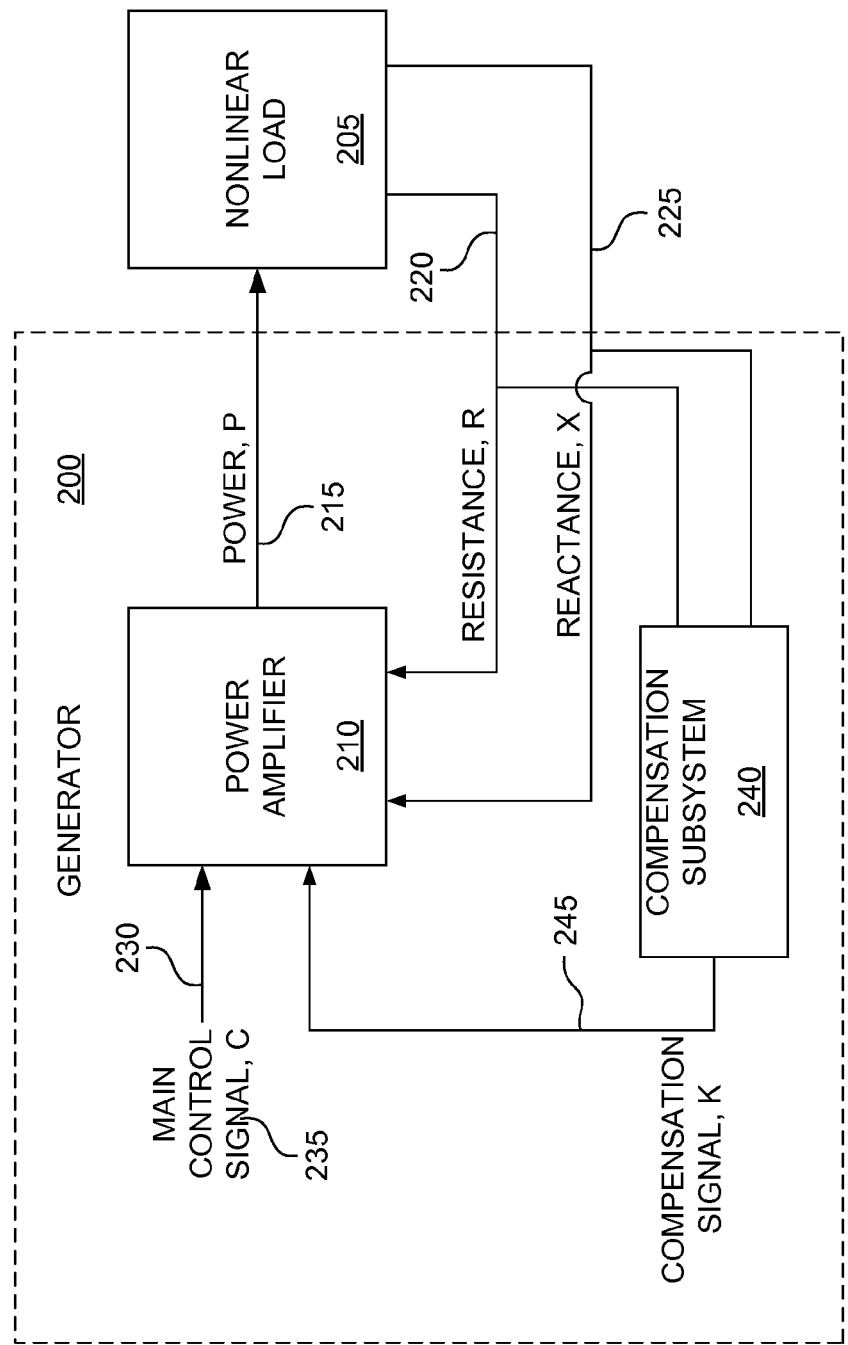
FIG. 2A is a block diagram of a generator connected with a nonlinear load in accordance with an illustrative embodiment of the invention.

Referring now to FIG. 2A, it is a block diagram of a generator 200 connected with a nonlinear load 205 in accordance with an illustrative embodiment of the invention. Generator 200 includes an "engine" of some kind. Examples of an "engine" include, without limitation, a power amplifier and a converter. In the particular embodiment illustrated in FIG. 2A, generator 200 includes a power amplifier 210, which delivers output power P 215 to nonlinear load 205. In one embodiment, generator 200 is a radio-frequency (RF) generator with a highly reactive source impedance, and nonlinear load 205 includes, among other things such as a matching network and cabling, a plasma. Such systems can be used in, for example, vapor deposition and etching applications. Nonlinear load 205 presents to power amplifier 210 a complex impedance Z with real and imaginary components resistance R 220 and reactance X 225, respectively (Z=R+jX).

Power amplifier 210 includes control input 230, to which main control signal C 235 is fed. For example, in one embodiment main control signal 235 is a voltage. In general, main control signal 235 is used to control the output power, output voltage, output current, or any combination thereof delivered by generator 200 to nonlinear load 205. Main control signal 235 is produced by a main power control loop (not shown in FIG. 2A). For example, in one typical implementation of a main power control loop, the fed-back power measured at the load and a power set point (desired output power 215) are fed to the inputs of a differential amplifier, the output of which (the error signal) is main control signal 235.

Compensation subsystem 240 measures the impedance of nonlinear load 205 and generates a compensation signal K 245 that corresponds to (depends on) the measured load impedance. Compensation signal 245, which is fed to power amplifier 210, renders the transfer function of the output power 215 of generator 200 with respect to main control signal 235 substantially insensitive to variations in the impedance of nonlinear load 205. The result is to stabilize the system by linearizing the output power 215 as a function of the main control signal 235. Compensation signal 245 for a given measured load impedance varies depending on the particular embodiment.

Figure 2B:
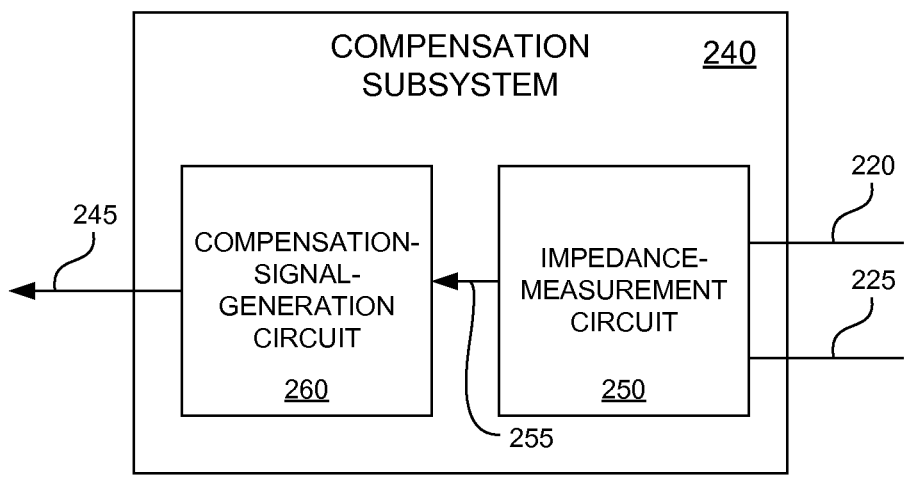
FIG. 2B is a block diagram of a compensation subsystem for a generator in accordance with an illustrative embodiment of the invention.

FIG. 2B is a block diagram of compensation subsystem 240 in accordance with an illustrative embodiment of the invention. Compensation subsystem 240 includes impedance-measurement circuit 250, which outputs measured load impedance 255, and compensation-signal-generation circuit 260, which generates compensation signal 245.

Compensation signal 245 can be determined in advance through a suitable calibration such as the following: First, generator 200 is connected with a test load having an adjustable impedance (e.g., a tuning circuit). The load is set initially to a nominal reference impedance with which generator 200 is designed to operate (e.g., 50 ohms). Second, a desired power set point $P_0$ is input to generator 200, and generator 200 is allowed to settle at output power $P_0$. Third, the main control signal 235 is frozen (fixed) at the current value that produces output power $P_0$ into the reference impedance. Fourth, the load impedance is varied, and the compensation signal 245 required to maintain an output power 215 of $P_0$ with that load impedance is recorded. The fourth step is then repeated for as many values of the load impedance as desired. The entire calibration procedure above is repeated for as many different output-power set points as desired.

In an illustrative embodiment, compensation subsystem 240 is implemented using high-speed digital algorithms in what may be termed by those skilled in the art as the "reflection-coefficient domain." In one embodiment, for example, compensation subsystem 240 is implemented along with other functions of generator 200 in a field-programmable gate array (FPGA). In other embodiments, compensation subsystem 240 is implemented using a processor that executes firmware or software. In general, the functionality of compensation subsystem 240 can be implemented in hardware, firmware, software, or a combination thereof.

In this illustrative embodiment, impedance-measurement circuit 250 is capable of measuring the impedance of nonlinear load 205 approximately once every microsecond, providing for the cancellation of frequencies associated with instability below approximately 500 kHz. This sampling rate is lower or higher in other embodiments.

In one embodiment, compensation-signal-generation circuit 260 includes a lookup table for each of a plurality of output power levels 215. Each lookup table for a given output power 215 maps each of a set of discrete values of the measured load impedance 255 to a corresponding discrete value of compensation signal 245. In such an embodiment, compensation-signal-generation circuit 260 includes a digital-to-analog (D/A) converter (not shown in FIG. 2B) to produce an analog compensation signal 245.

In some embodiments the calibration procedure for a given output power level is performed for only a few points (e.g., four load-impedance values other than the reference impedance that bracket the reference impedance on a Smith chart). For other values of the measured load impedance 255, the compensation signal K can be obtained from those few stored values by interpolation, for example. In some embodiments, slopes (gradients) of compensation signal 245 as a function of the measured load impedance 255 are stored in the lookup tables, and the compensation signal 245 for a specific measured load impedance 255 is interpolated by multiplying the appropriate slope by the difference between the measured load impedance 255 and the reference impedance. Also, in some embodiments, fast numerical algorithms such as successive approximation are used to perform mathematical operations such as division, improving the speed of compensation subsystem 240.

Figure 3:
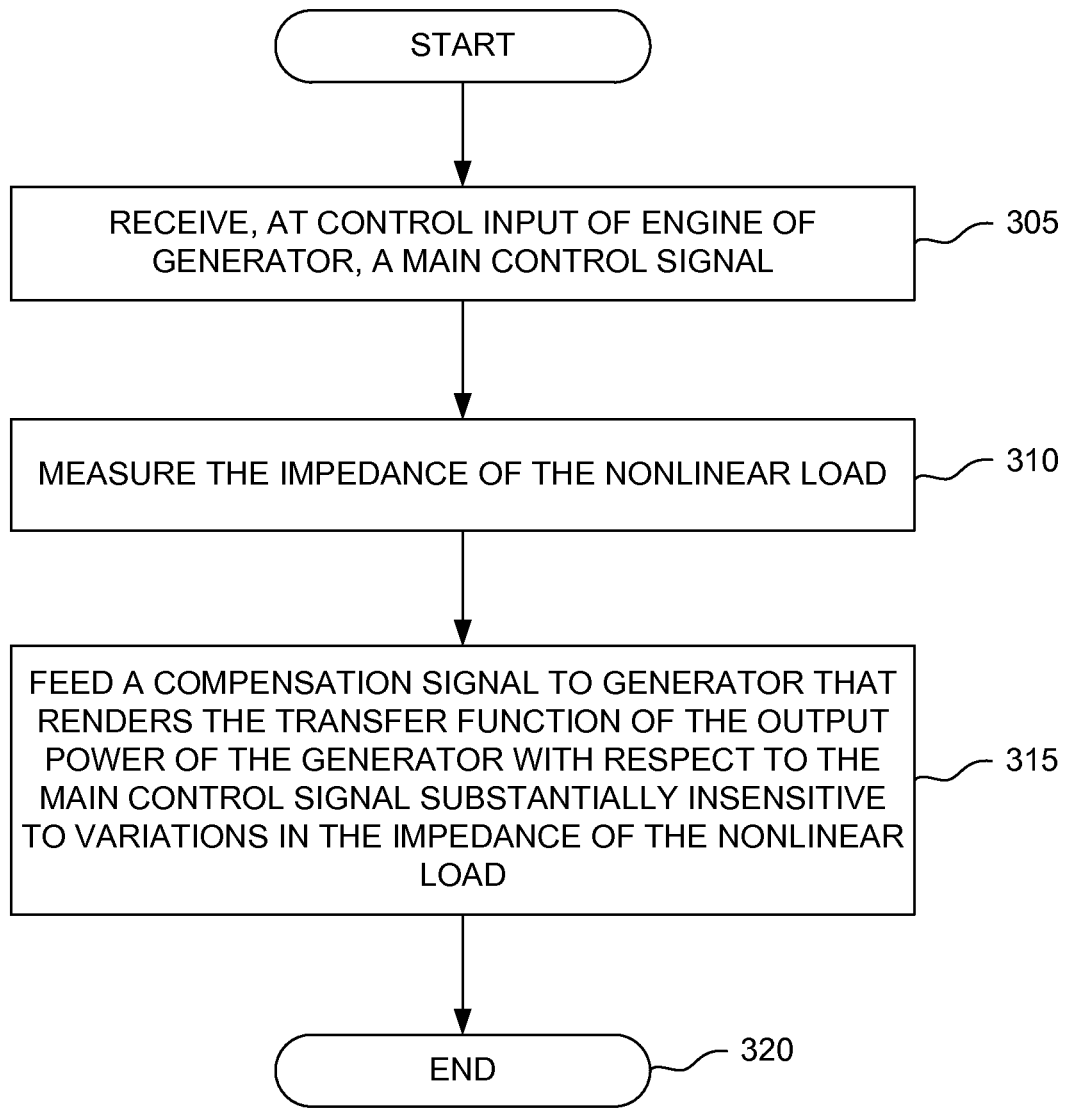
FIG. 3 is a flowchart of a method for modifying interactions between a generator and a nonlinear load in accordance with an illustrative embodiment of the invention.

FIG. 3 is a flowchart of a method for modifying interactions between a generator and a nonlinear load in accordance with an illustrative embodiment of the invention. At 305, power amplifier 210 receives at control input 230 a main control signal 235. At 310, impedance-measurement circuit 250 measures the impedance 255 of nonlinear load 205. At 315, compensation-signal-generation circuit 260 produces a compensation signal 245 that is fed to power amplifier 210. Compensation signal 245 renders the transfer function of the output power 215 of generator 200 with respect to main control signal 235 substantially insensitive to variations in the impedance of nonlinear load 205. Thus, compensation signal 245, in combination with main control signal 235, causes generator 200 to maintain a stable (substantially constant) output power 215 at a desired level $P_0$ despite variations in the impedance of nonlinear load 205. At 320, the process terminates.

Figure 4:
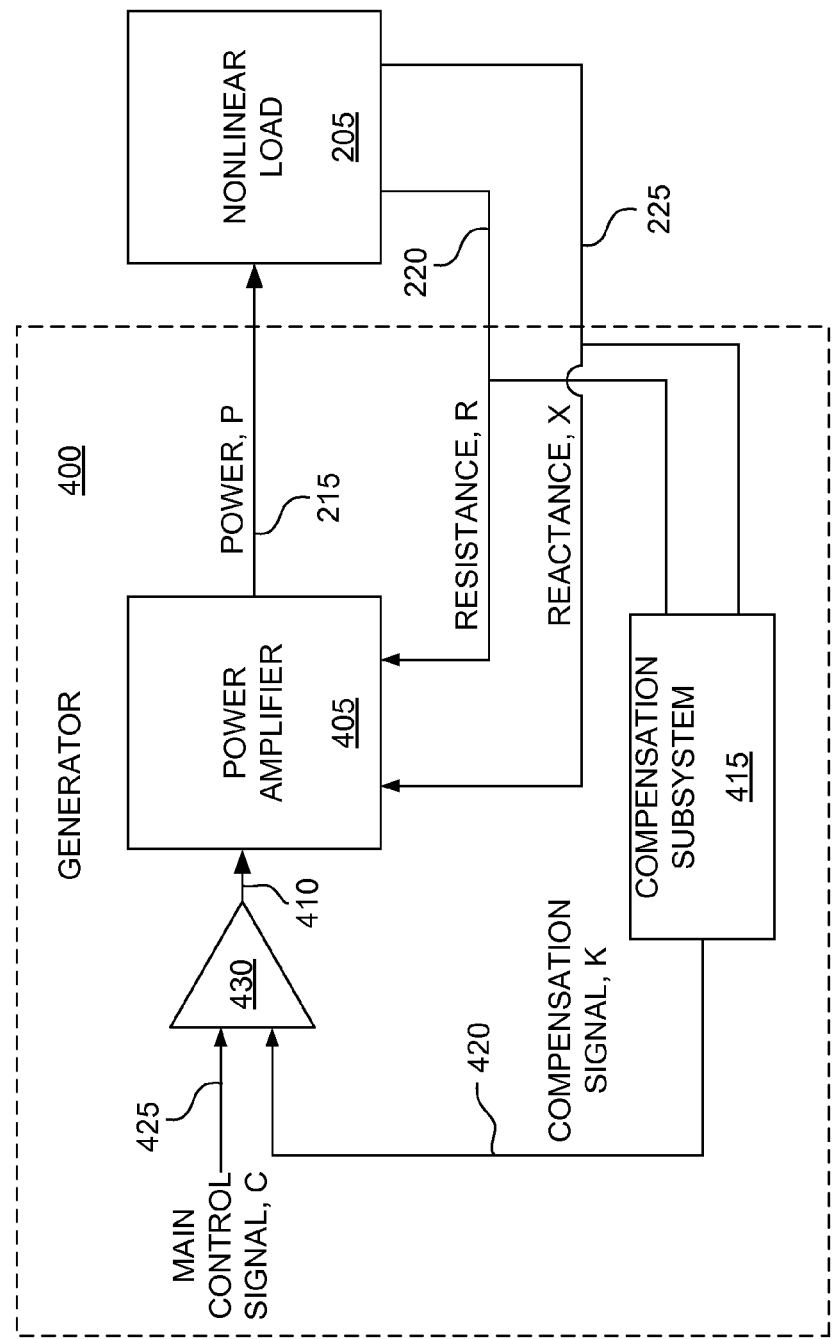
FIG. 4 is a block diagram of a generator connected with a nonlinear load in accordance with another illustrative embodiment of the invention.

FIG. 4 is a block diagram of a generator 400 connected with a nonlinear load 205 in accordance with another illustrative embodiment of the invention. Generator 400 includes power amplifier 405 with control input 410. Compensation subsystem 415 produces a compensation signal K 420 that is fed, along with main control signal 425, to summing circuit 430. The output of summing circuit 430 is fed to control input 410. As in the embodiment discussed above in connection with FIGS. 2A-3, compensation signal 420 has the effect of rendering the transfer function of the output power 215 of generator 400 with respect to main control signal 425 substantially insensitive to variations in the impedance of nonlinear load 205 to prevent instability of output power 215 that would otherwise result due to interactions between generator 400 and the impedance of nonlinear load 205.

Figure 5A:
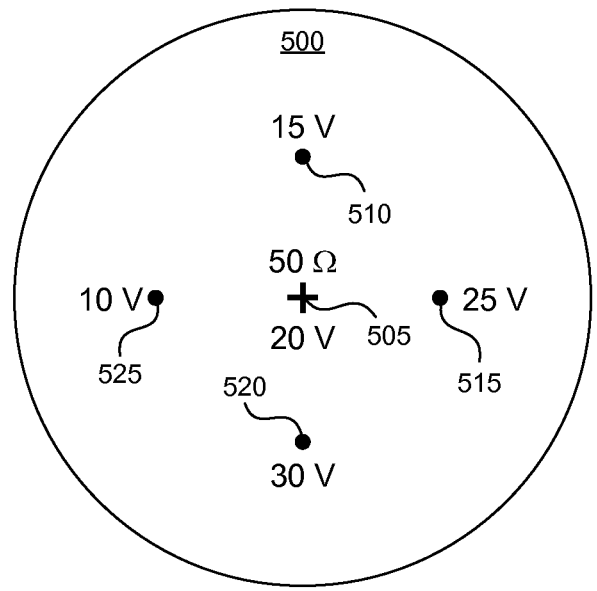
FIG. 5A is an illustration of a simplified Smith chart showing the required generator control signal C for each of a set of load impedances for a particular output power $P_0$ in accordance with an illustrative embodiment of the invention.

FIG. 5A is an illustration of a simplified Smith chart 500 showing the required power-amplifier control signal at control input 410 for each of a set of load impedances for a particular output power $P_0$ (215) in accordance with an illustrative embodiment of the invention. In the hypothetical example of FIG. 5A, the main control signal 425 required to produce a desired output-power level of 100 W ($P_0$) into 50 ohms (the reference impedance) is 20V. The reference impedance corresponds to point 505 at the center of Smith chart 500. Points 510, 515, 520, and 525 correspond to measured load impedances 255 that differ from reference impedance 505. The control signal at control input 410 that would be required to produce the desired output power $P_O$ for each of these impedances is shown on simplified Smith Chart 500. These various values of the required control signal at control input 410 as a function of load impedance can be determined through a calibration procedure such as that described above and stored in a lookup table to which compensation-signal-generation circuit 260 has access.

Figure 5B:
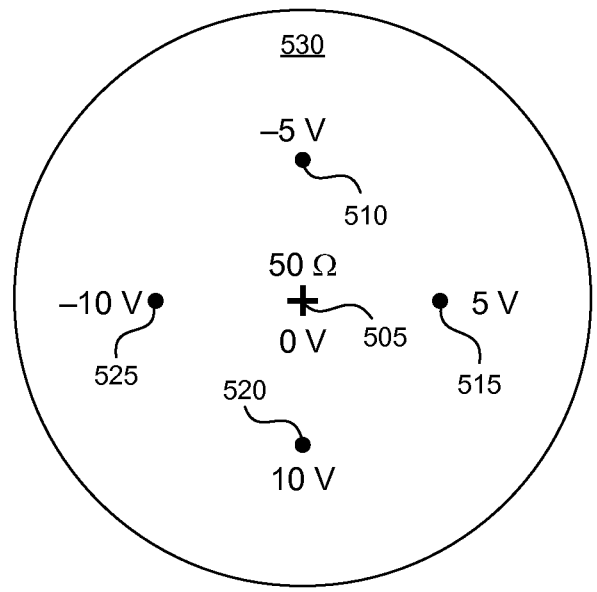
FIG. 5B is an illustration of a simplified Smith chart showing the compensation signal K for each of a set of load impedances for the same output power $P_0$ as in FIG. 5A in accordance with an illustrative embodiment of the invention.

FIG. 5B is an illustration of a simplified Smith Chart 530 showing the compensation signal K 420 corresponding to each of the set of load impedances (505, 510, 515, 520, and 525) plotted in FIG. 5A for the same desired output power $P_O$ in accordance with an illustrative embodiment of the invention. In this particular embodiment, compensation signal 420 is the difference between a control signal that would cause generator 400 to produce a particular output power 215 of $P_O$ when the impedance of nonlinear load 205 is the measured impedance and a control signal that would cause generator 400 to produce that same output power $P_O$ into the reference impedance. This difference is plotted for each of the points 505, 510, 515, 520, and 525 on simplified Smith Chart 530.

The sum produced by summing circuit 430—the sum of main control signal 425 and compensation signal 420—is thus the control signal at control input 410 that causes power amplifier 405 to produce the desired output power $P_O$ into the measured load impedance 255 for essentially the same main control signal value 425, irrespective of load impedance, thus rendering main control signal 425 insensitive to variations in the impedance of nonlinear load 205. Of course, when the measured load impedance 255 is the reference impedance (point 505 in FIG. 5B), the compensation signal 420 is zero.

Figure 6:
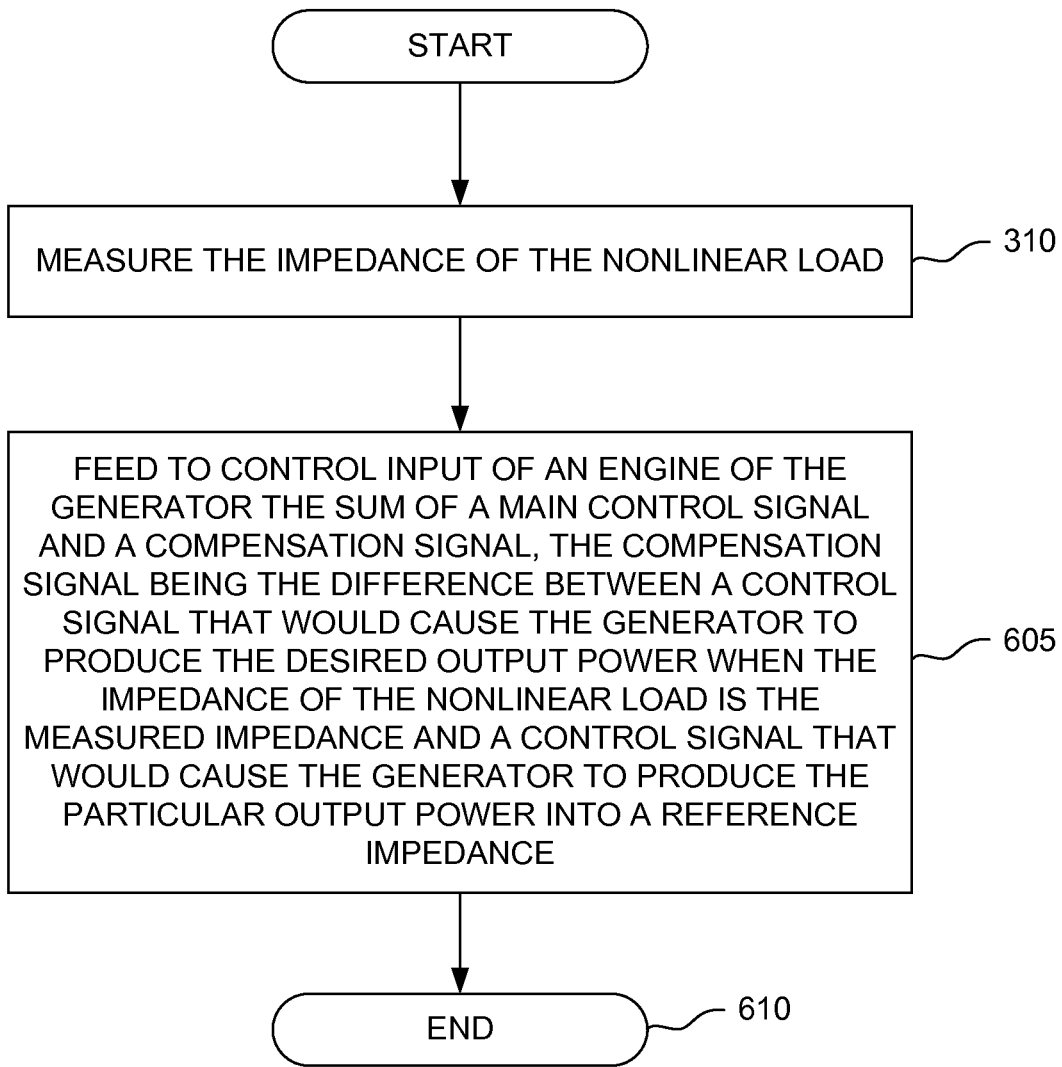
FIG. 6 is a flowchart of a method for modifying interactions between a generator and a nonlinear load in accordance with another illustrative embodiment of the invention.

FIG. 6 is a flowchart of a method for modifying interactions between a generator and a nonlinear load in accordance with another illustrative embodiment of the invention. At 310, impedance-measurement circuit 250 measures the impedance 255 of nonlinear load 205. At 605, the sum of main control signal 425 and compensation signal 420 is fed to control input 410 of power amplifier 405, the compensation signal 420 being the difference between a control signal that would cause generator 400 to produce a particular output power 215 of $P_O$ when the impedance of nonlinear load 205 is the measured impedance and a control signal that would cause generator 400 to produce that same output power $P_O$ into the reference impedance. The result is that instability of the output power 215 that would otherwise occur due to interactions between the generator 400 and the impedance of the nonlinear load 205 is prevented. The process terminates at 610.

Figure 7:
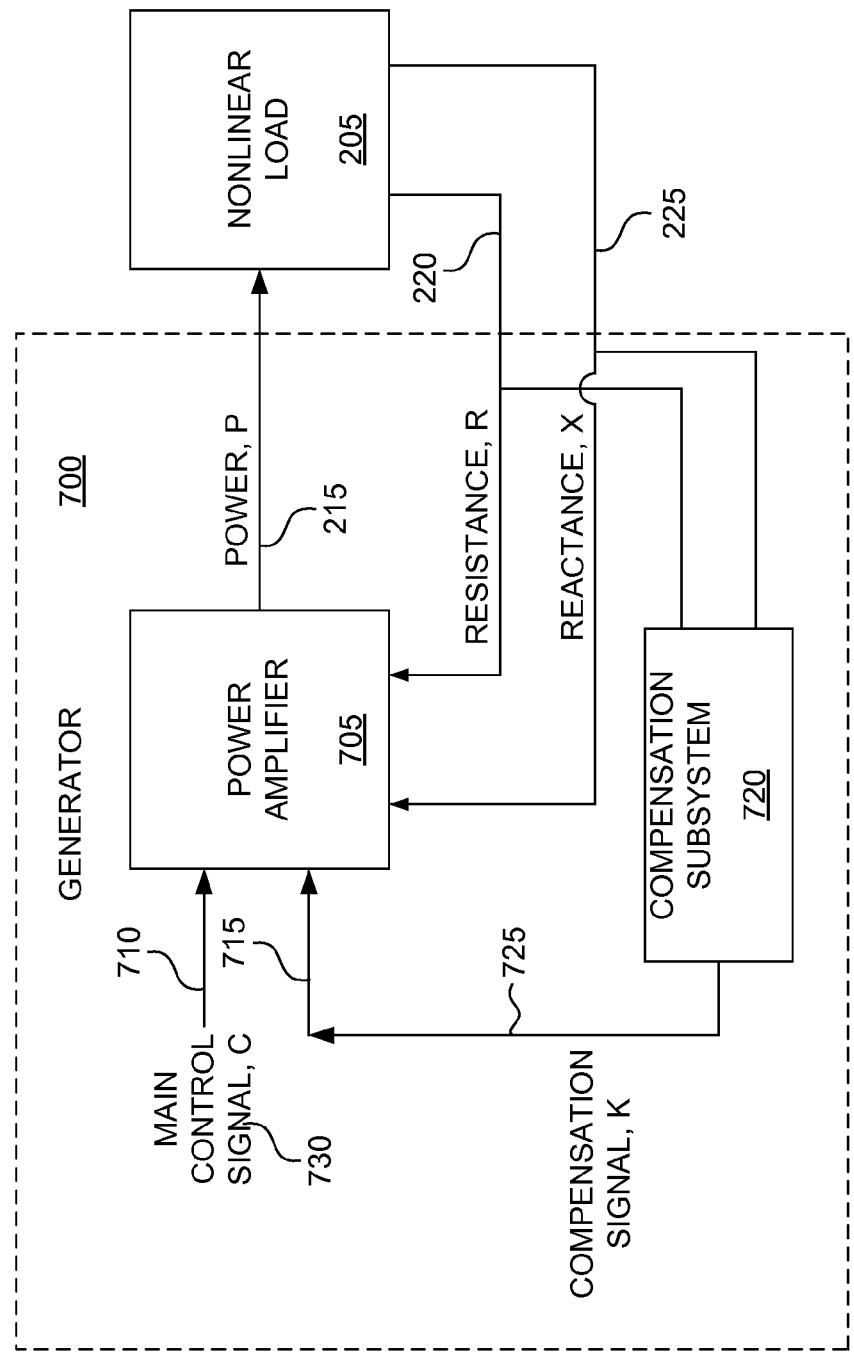
FIG. 7 is a block diagram of a generator connected with a nonlinear load in accordance with yet another illustrative embodiment of the invention.

FIG. 7 is a block diagram of a generator 700 connected with a nonlinear load 205 in accordance with yet another illustrative embodiment of the invention. In this embodiment, power amplifier 705 includes both a primary control input 710 and a secondary control input 715. Primary control input 710 receives a main control signal C 730.

Compensation subsystem 720 produces a compensation signal 725 specifically tailored for connection with secondary control input 715. Note that the specific compensation signal 725 as a function of load impedance depends on the design of power amplifier 705. Regardless of the design of power amplifier 705, however, a calibration procedure such as that described above can be performed to determine the compensation signal 725 for each of a set of values of the measured load impedance 255 for a given desired output power $P_O$.

The combination of main control signal 730 and compensation signal 725 causes power amplifier 705 to produce the desired output power $P_O$ in spite of variations of the impedance of nonlinear load 205. In other words, compensation signal 725 renders the transfer function of the output power 215 of generator 700 with respect to main control signal 730 substantially insensitive to variations in the impedance of nonlinear load 205, thereby stabilizing the output power 215 of generator 700 as a function of the main control signal 730.

Figure 8:
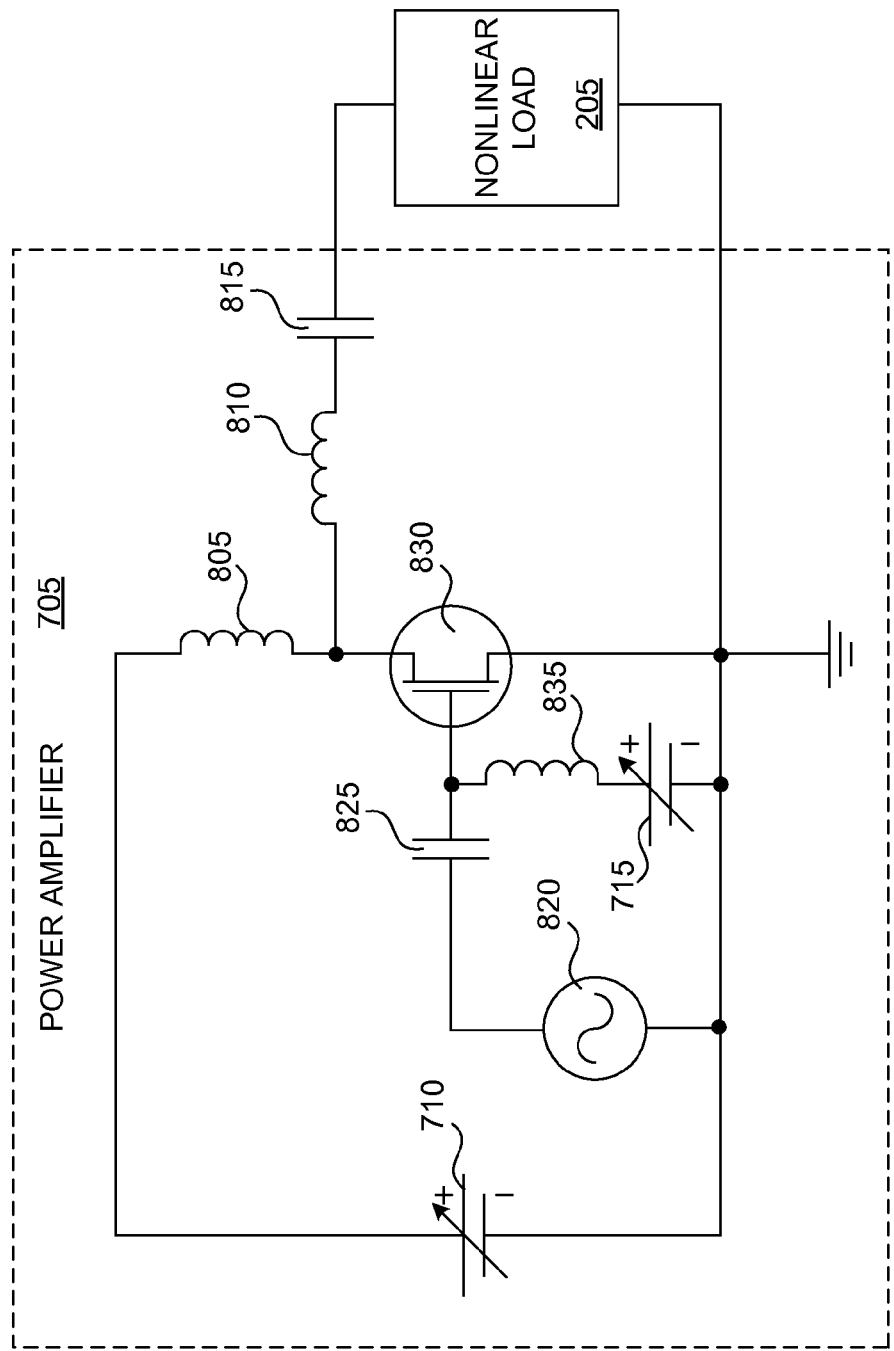
FIG. 8 is a circuit diagram of a power amplifier that includes both primary and secondary control inputs in accordance with an illustrative embodiment of the invention.

FIG. 8 is a circuit diagram of a power amplifier 705 that includes both primary and secondary control inputs 710 and 715, respectively, in accordance with an illustrative embodiment of the invention. In FIG. 8, primary control input 710 (a voltage in this example) is connected with choke 805. A resonant circuit including inductor 810 and capacitor 815 is connected between the opposite node of choke 805 and nonlinear load 205. Oscillator 820 is connected with capacitor 825, the opposite node of which is connected with the gate of metal-oxide-semiconductor field-effect transistor (MOSFET) 830. In this particular embodiment, secondary control input 715 is a bias voltage that is connected in series with choke 835, the opposite node of which is connected between a node of capacitor 825 and the gate of MOSFET 830. FIG. 8 is merely one example of a secondary control input 715. In other embodiments, secondary control input 715 differs from the bias-voltage example shown in FIG. 8.

Figure 9:
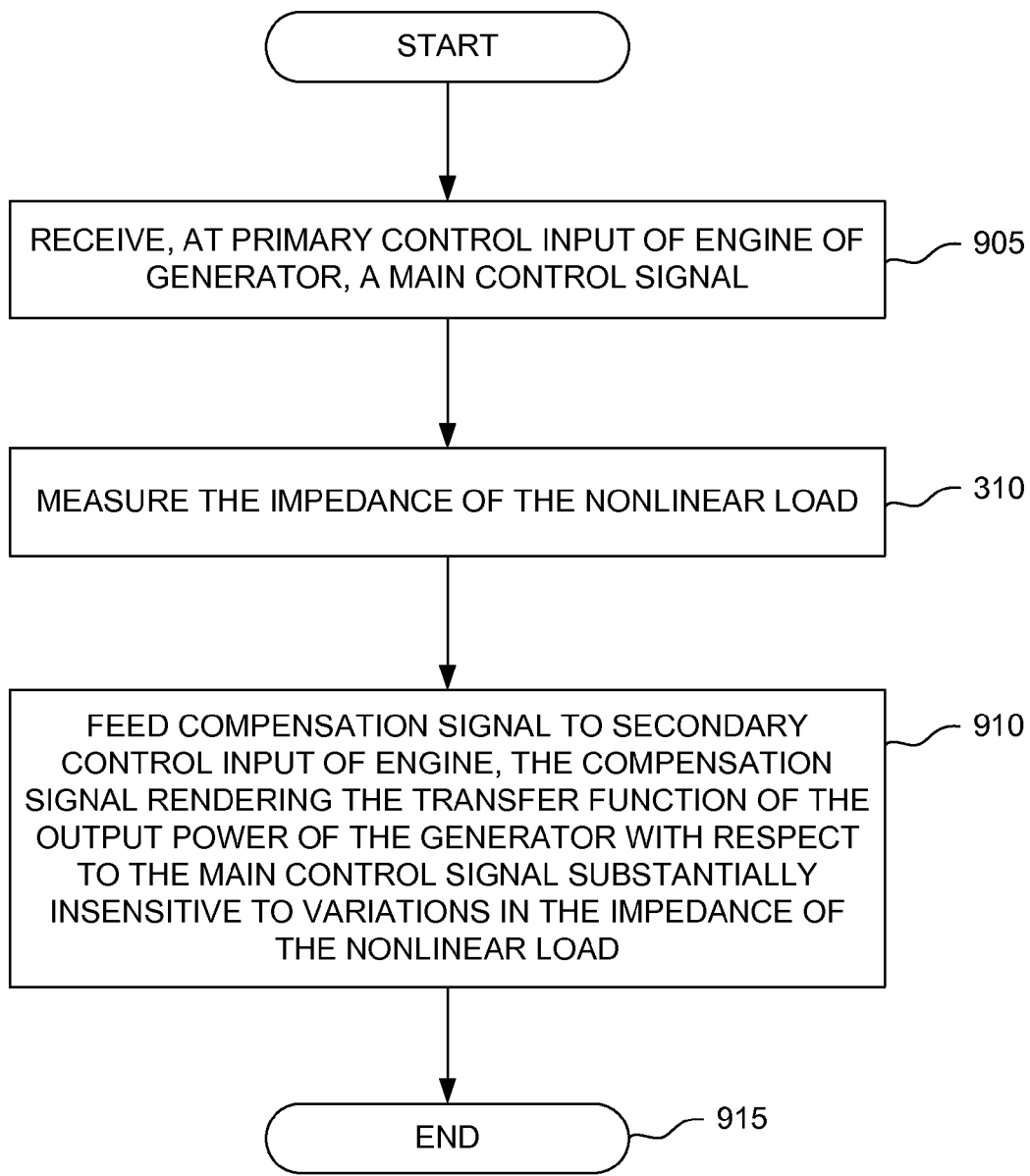
FIG. 9 is a flowchart of a method for modifying interactions between a generator and a nonlinear load in accordance with yet another illustrative embodiment of the invention.

FIG. 9 is a flowchart of a method for modifying interactions between a generator and a nonlinear load in accordance with yet another illustrative embodiment of the invention. At 905, power amplifier 705 receives, at its primary control input 710, a main control signal 730. At 310, impedance-measurement circuit 250 measures the impedance 255 of nonlinear load 205. At 910, compensation subsystem 720 feeds a compensation signal 725 to secondary input 715 of power amplifier 705, the compensation signal 725 rendering the transfer function of the output power 215 of generator 700 with respect to main control signal 730 substantially insensitive to variations in the impedance of nonlinear load 205, thereby preventing instability of the output power 215 that would otherwise result due to interactions between the generator 700 and the impedance of the nonlinear load 205. The process terminates at 915.

In some embodiments, the compensation signal effectively nulls the inner product in Equation 1 above. That is, the compensation signal nullifies the sensitivity of the power amplifier to changes in the impedance of the nonlinear load. In other embodiments, additional compensation can be applied to the power amplifier via the compensation signal to render the inner product in Equation 1 other than zero, causing the power amplifier and the impedance of the nonlinear load to interact in a particular desirable manner. In some embodiments, this additional compensation to achieve a desired interaction between the generator and the nonlinear load can be specified by a user of the generator. This additional compensation can provide, for example, additional stability beyond that provided by simply nullifying the sensitivity of the power amplifier to changes in the load impedance.

Figure 10:
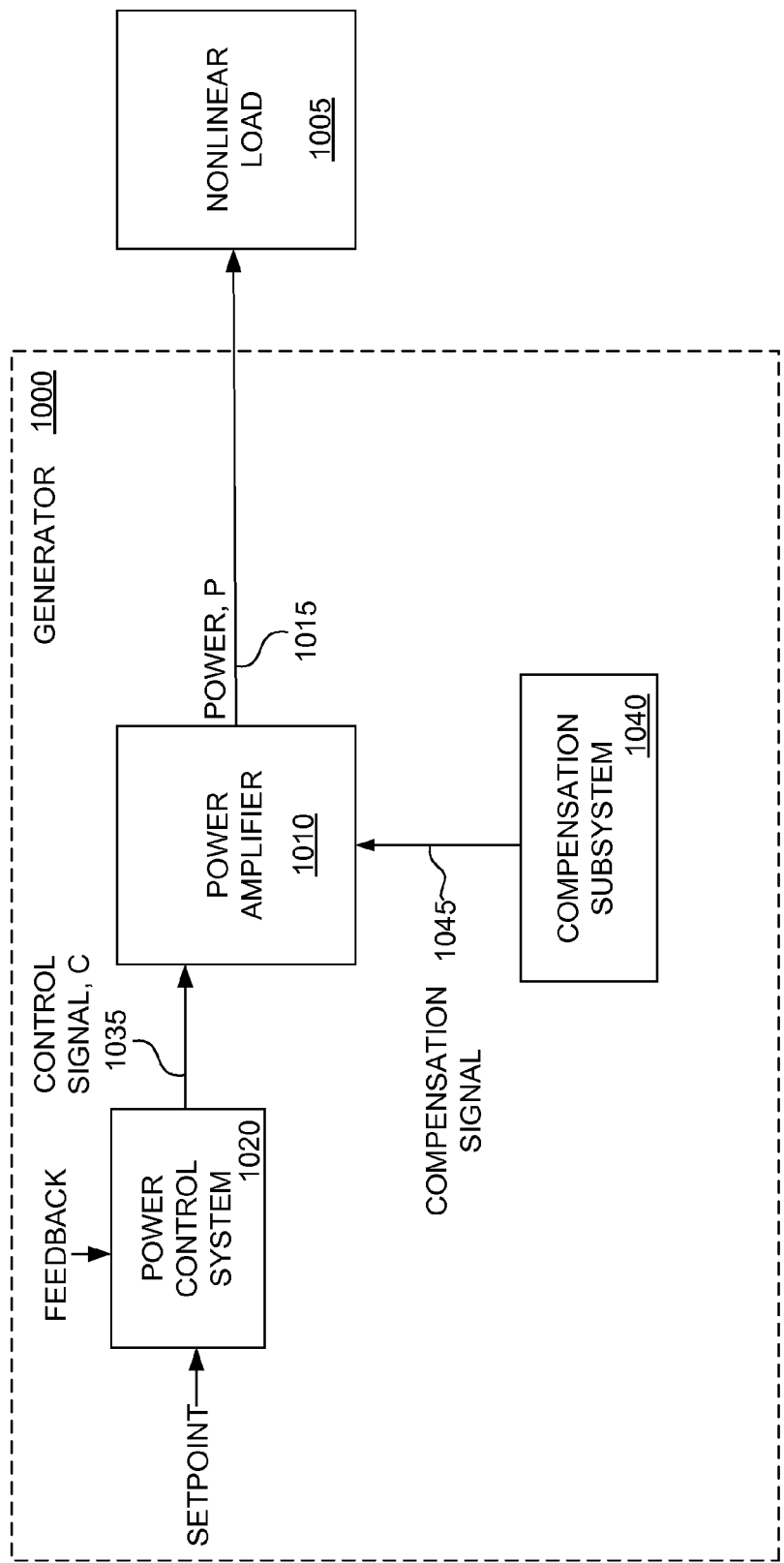
FIG. 10 is a block diagram of a generator connected with a nonlinear load in accordance with yet another illustrative embodiment of the invention.

Referring to FIG. 10, it is a block diagram depicting a plasma processing system that includes a generator 1000 connected with a nonlinear load 1005 in accordance with another embodiment of the invention. As shown, the generator 1000 includes a power amplifier 1010, which delivers output power P 1015 to the nonlinear load 1005, and the generator 1000 includes a compensation subsystem 1040 and power control system 1020 that are coupled to the power amplifier 1010.

In general, the generator 1000 in this embodiment operates to apply power to the non-linear load 1005 at one or more desired frequencies and at one or more desired power levels (e.g., to ignite and sustain a plasma). For example, the generator 1000 may apply power from a few Watts to several Kilowatts, and the frequency of the applied power may vary from a few Hertz to several Megahertz. By way of further example, the generator 100 generally applies power at 13.56 Megahertz, but this is certainly not required, and it is contemplated that the generator 100 may apply power at frequencies that may exceed 60 Megahertz. Moreover, as discussed further herein, it is contemplated that the frequency of the applied power may be adjusted for efficiency and/or stability purposes.

The power amplifier 1010 may be realized by a variety of topologies including single-ended, double-ended, and push pull topologies, and may operate across a range of amplifier types. In some implementations for example, the power amplifier 1010 may operate across a range of classes including Class A, Class B, Class D and Class E. And in many implementations the power amplifier 1010 is implemented using switch-mode technologies (e.g., the topology depicted in FIG. 8), which offer numerous advantages including improved efficiency, compact size and low cost, but one disadvantage—when typical control schemes are utilized—can be an increased risk of generator-plasma interaction that can both promote the formation of plasma instabilities and increase the severity of plasma instabilities.

As shown in FIG. 10, the generator 1000 in this embodiment includes a power control system 1020 that is configured to provide a power control signal 1035 to the power amplifier 1010 based upon a power-level set point (e.g., operator set point) and feedback that is indicative of the output power 1015. For example, the power control system 1020 may include control loop components that are well known to those of ordinary skill in the art, and in light of this specification, those of ordinary skill in the art may readily carry out the adaptation of typical power control loops to operate with embodiments of the present invention.

Also shown is a compensation subsystem 1040 that generally operates in this embodiment to manage (e.g., reduce or eliminate) instabilities in the output power 1015 by providing a controllable compensation signal 1045 to the amplifier 1010 without utilizing impedance measurements or other real time feedback. In many implementations for example, an operator may utilize the compensation subsystem 1040 to generate a desired compensation signal 1045 that renders the processing system stable in connection with one or more particular processes.

FIG. 10 is an example of many embodiments discussed herein that utilize at least two control inputs (e.g., the control signal 135 and the compensation signal 1045) wherein at least one of the at least two control inputs (e.g., the compensation signal 1045) is used to modify a sensitivity of the generator to an impedance of a load and at least one of the at least two control inputs (e.g., the control signal 1035) is used to control an output power of the generator so that a same level of power can be delivered to the load with different combinations of levels of the at least two control inputs, and a combination of control inputs that produces a desired level of power and an acceptable sensitivity to the impedance of the load may be utilized.

As depicted, the compensation subsystem 1040 in this embodiment does not generate the compensation signal 1045 based upon a feedback signal. More specifically, unlike one or more other embodiments discussed herein, the present embodiment does not receive an indication of the impedance of the nonlinear load 1005. Moreover, the compensation subsystem 1040 in this embodiment, unlike other embodiments discussed further herein, does not receive any signals indicative of power instability. Although the compensation signal 1045 is depicted as a single control signal for simplicity, as discussed further herein, the compensation signal 1045 may include multiple signals that are sent over separate lines or are multiplexed over a single line.

Figure 11:
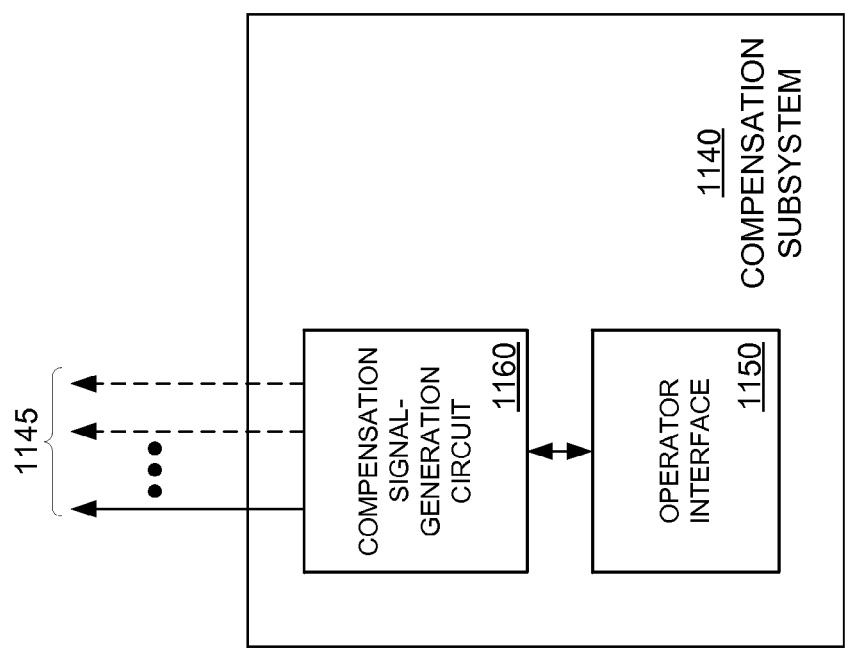
FIG. 11 is a block diagram depicting an exemplary compensation subsystem in accordance with another exemplary embodiment of the invention.

Referring to FIG. 11, for example shown is an exemplary compensation subsystem 1140 that may be used to realize the compensation subsystem 1040 described with reference to FIG. 10. As shown in FIG. 11, the compensation subsystem 1140 in this implementation includes an operator interface 1150 coupled to a compensation signal-generation circuit 1160. In this embodiment, the operator interface 1150 functions to enable a user to control the operation of the compensation signal-generation circuit 1160. More specifically, the compensation signal-generation circuit 1160 in this embodiment enables a user to affect changes in one or more compensation signals 1145.

For example, the operator interface 1150 may be utilized to enable an operator set bias parameters (e.g., voltage magnitude levels, waveform attributes, and/or pulse width modulation levels), and may be utilized to enable or disable functional aspects of the compensation signal-generation circuit 1160. As one of ordinary skill in the art will appreciate, the operator interface 1150 may be realized by a variety of different components such as a display (e.g., touch screen display), pointing device (e.g., mouse), keyboard or other manual devices, in addition to other software, hardware, and/or firmware.

As discussed in connection with FIGS. 8 and 9, a compensation signal may be used to apply a bias voltage to a switching element (e.g., MOSFET 830) of the power amplifier 1010, and as a consequence of the controllable bias voltage, a conduction angle (or "on time") of the power amplifier may be controlled. And in many variations of the embodiment depicted in FIG. 11, the operator interface 1150 enables a user to control a level of the bias voltage that is applied to one or more switching elements of the power amplifier 1010 to effectuate a desired conduction angle. But in addition to, or instead of, bias voltage (e.g., bias voltage 715), a reference signal (also referred to herein as the drive signal) that is also utilized by the power amplifier 1010 may be adjusted to affect the conduction angle.

Figure 12:
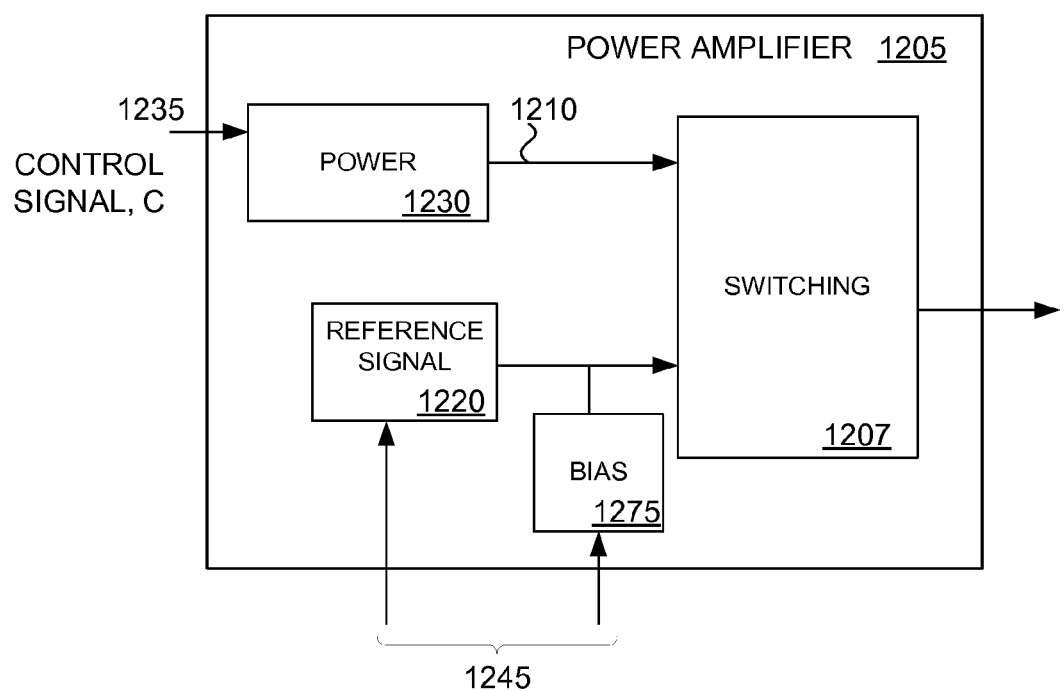
FIG. 12 is a block diagram depicting an exemplary power amplifier.

Referring next to FIG. 12, for example, it is a block diagram depicting general functional components of a power amplifier that may be used to realize the power amplifiers described herein. As shown, the power amplifier 1205 includes a switching component 1207 coupled to a power component 1230, a reference signal generator 1220, and a bias supply 1275. The switching component 1207 may include one or more switching elements (e.g., FETs) (e.g., MOSFET 830) that may be arranged and configured in a variety of topologies. And the power component 1230 may include a DC power supply that is adapted to apply a rail voltage 1210 that may vary responsive to a control signal 1235 (e.g., control signal 1035 from a power control system). In some implementations, for example, the rail voltage 1210 may vary between 0 to 200 VDC, but in other implementations the voltage may exceed 200 VDC.

The reference signal generator 1220 generally operates to apply a reference signal to the switching component 1207 that affects how the rail voltage 1210 is applied to an output of the switching component 1207. For example, the reference signal generator 1220 may include one or more controllable oscillators (e.g., oscillator 820) that may operate within narrow frequency ranges or over broad frequency ranges.

In some variations, the compensation signal 1245 may control the reference signal generator 1220 so that the magnitude of the reference signal that is applied to the switching component 1207 is adjusted; thus effecting a desired conduction angle of the power amplifier 1205. In other variations, the waveform of the reference signal 1220 may be controlled to effectuate a desired conduction angle.

Moreover, in addition to—or independently of—adjustments to the conduction angle, the frequency of the reference signal may be adjusted to remove and/or prevent instabilities in the output power. U.S. patent application Ser. No. 12/184, 535, filed Apr. 25, 2010, entitled DETECTING AND PREVENTING INSTABILITIES IN PLASMA PROCESSES, which is incorporated herein by reference in its entirety, discloses techniques for detecting instabilities and techniques for adjusting frequency to reduce and/or prevent instabilities from occurring.

The bias supply 1275 generally operates to enable a voltage level that is applied to the gate of one or more switching elements (e.g., FETs) to be controlled to enable the conduction angle of the power amplifier 1205 to be controlled. The bias supply 1275 may be realized by a controllable DC power supply that is capable of operating over a voltage range of −7 to +4 VDC, but other voltage ranges are certainly contemplated.

In some modes of operation, the output of the bias supply 1275 is a non-varying DC voltage that is set (e.g., using the operator interface 1150) by an operator. For example, an operator may be aware of a particular bias voltage that renders the power amplifier stable in one or more particular process environments, and the bias supply need not be automatically adjusted.

Moreover, in addition to—or independently of—adjustments to the conduction angle, the bias supply and rail voltage (controlled by the power component 1230) may be controlled to effectuate desired performance characteristics of the power amplifier. U.S. patent application Ser. No. 12/650,652, filed Dec. 31, 2009, entitled DUAL-MODE CONTROL OF A POWER GENERATOR, which is incorporated herein by reference in its entirety, discloses techniques for controlling rail and bias voltage for a variety of operational benefits.

In other modes of operation, the bias supply 1275 may be controlled to apply a varying voltage to the switching component 1207. For example, a duty cycle of a square wave may be adjusted by pulse-width modulation (PWM) to effectuate a desired conduction angle, and/or a magnitude of the voltage applied by the bias supply 1275 may be adjusted. The PWM and/or voltage-magnitude may be either controlled by an operator or may be automatically adjusted responsive to feedback mechanisms such as those discussed further herein.

As shown in FIG. 12, one or both of the reference signal generator 1220 and the bias supply 1275 may be controlled by one or more corresponding compensation signals 1245. In several embodiments for example, only the bias supply 1275 is controlled to adjust the conduction angle of the power amplifier 1205, but in other embodiments only the reference signal generator 1220 is controlled to adjust the conduction angle of the power amplifier 1205. But in yet other embodiments, both the reference signal generator 1220 and the bias supply 1275 are controlled to adjust the conduction angle of the power amplifier 1205.

As one of ordinary skill in the art will appreciate in view of this disclosure, in many modes of operation, the power control loop (e.g., within power control system 1020) automatically adjusts the control signal 1235 (e.g., responsive to feedback from power sensors at the output of the power amplifier 1205) so that the power component 1230 adjusts the rail voltage 1210, and hence, the power level of the output power. For example, if an adjustment to the conduction angle of the power amplifier 1205 affects the output power (e.g., lowers output power), the power control loop in many embodiments alters the control signal 1235 to increase the output power to maintain a power output level at a set point. As a consequence, the conduction angle, and hence stability, of the power amplifier 1205 may be adjusted while maintaining a level of desired output power (e.g., a level of output power to sustain a plasma).

Figure 13:
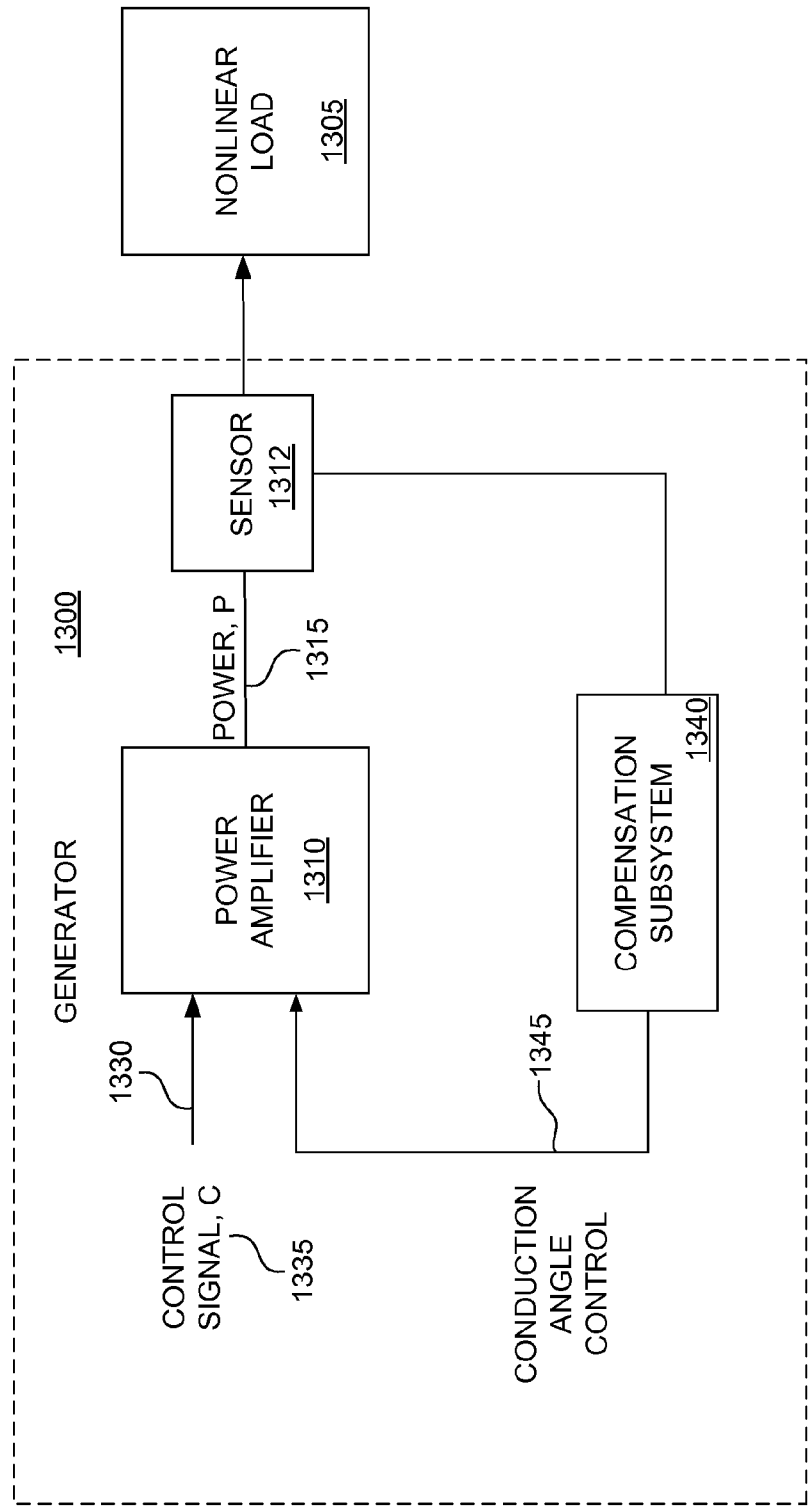
FIG. 13 is a block diagram of another exemplary generator connected with a nonlinear load in accordance with another embodiment of the invention.

Referring to FIG. 13, it is a block diagram depicting a plasma processing system that includes a generator 1300 connected with a nonlinear load 1305 in accordance with another illustrative embodiment of the invention. As shown, the generator 1300 in this embodiment includes a power amplifier 1310, which delivers output power P 1315 to the nonlinear load 1305, and the generator 1300 includes a compensation subsystem 1340 that is coupled to the power amplifier 1310 and a sensor 1312 that is coupled to an output of the power amplifier 1310.

As shown, the compensation subsystem 1340 in this embodiment provides a compensation signal 1345 to control the conduction angle of the power amplifier 1310 responsive to one or more signals from the sensor 1312. The sensor 1312 depicted in FIG. 13 in many embodiments is part of the generator 1300 (e.g. within the same housing along with the amplifier 1310), but this is not required. In general, the sensor 1312 is configured to provide one or more signals indicative of one or more characteristics of the power 1315, which the compensation subsystem 1340 utilizes to control the conduction angle of the amplifier 1310. In many embodiments for example, the sensor 1312 detects forward (FWD) and reflected (RFL) RF signals that are indicative of the power 1315, and the sensor 1312 may be realized by a variety of components including a directional coupler and VI sensor.

Figure 14:
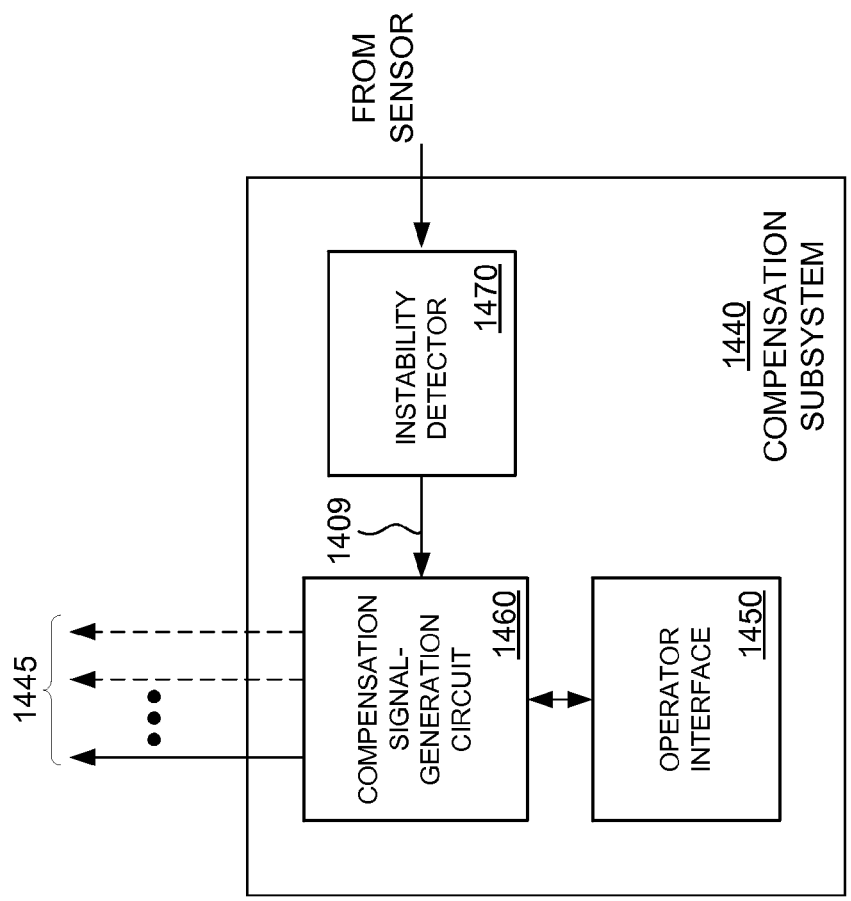
FIG. 14 is a block diagram depicting another exemplary compensation subsystem in accordance with yet another exemplary embodiment of the invention.

Referring next to FIG. 14, shown is an exemplary embodiment of a compensation subsystem 1440 that may be utilized to realize the compensation subsystem 1340 described with reference to FIG. 13. In general, the depicted components function to identify whether an instability is present in the output power of a power amplifier (e.g., power amplifier 1310) and adjust a conduction angle of the power amplifier to remove and/or prevent the instability. In addition to controlling a conduction angle of the power amplifier, the compensation subsystem 1440 may also be configured so that, in some modes of operation, the compensation subsystem 1440 controls a frequency of the power amplifier's reference signal to reduce/prevent instabilities (e.g., by aligning the impedance trajectories of the plasma and the power amplifier).

As shown, the compensation signal-generator circuit 1460 is configured to generate a compensation signal 1445 in response to the instability signal 1409 from an instability detector 1470 to control the conduction angle of the power amplifier 1310. In many variations, the compensation signal-generation circuit 1460 periodically checks the instability signal 1409 and adjusts conduction angle of the power amplifier 1310 accordingly.

Also depicted in this embodiment is an optional operator interface 1450, which may operate in much the same way as the operator interface 1150 described with reference to FIG. 11, but in addition, the operator interface 1450 in this embodiment may also be utilized to set one or more instability threshold levels that set a level at which the compensation signal-generation circuit 1460 responds to detected instabilities. For example, it is contemplated that some oscillations may be present at a tolerable level in the output power that do not need to be addressed by adjusting the conduction angle of the amplifier.

It should be recognized that the depiction of the compensation subsystem 1440 in FIG. 14 is a logical depiction of functional components and is not intended to be a hardware diagram; thus, the depicted functional components may realized by several distributed and disparate components, or integrated components, of hardware, software, and/or firmware.

Figure 15:
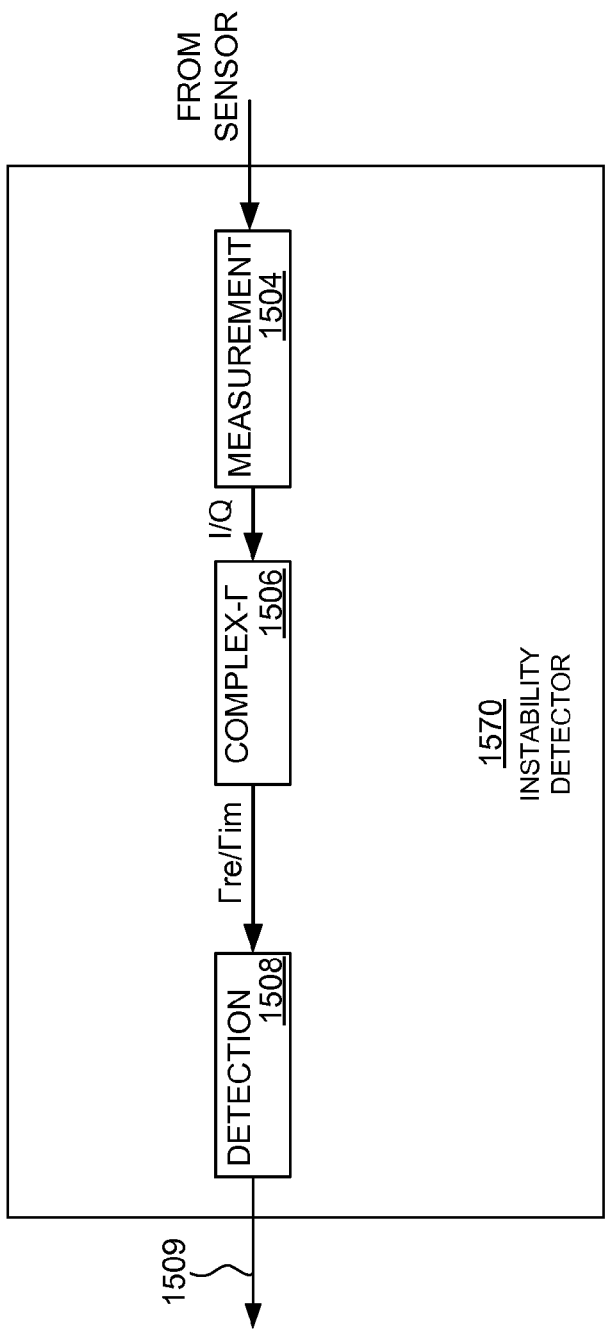
FIG. 15 is a block diagram depicting an embodiment of an exemplary instability detector.

Referring next to FIG. 15, shown is an exemplary embodiment of an instability detector 1570 that may be utilized to realize the instability detector 1470 described with reference to FIG. 14. As shown, a measurement component 1504, complex-$\Gamma$ component 1506, and a detection component 1508 represent exemplary components that may be utilized to detect whether instability is present. It should be recognized that the components depicted in FIG. 15 represent an exemplary approach to stability detection and that other techniques discussed further herein with reference to FIG. 17 may be utilized to detect instabilities. It should also be recognized that the depiction of these components is merely logical and not meant to be a hardware diagram; thus the depicted components may be combined or further separated, and generally, the components may be realized by hardware, software, firmware or a combination thereof.

The measurement component 1504 in this embodiment is generally configured to receive the output of a sensor (e.g., sensor 1312) and provide in-phase and quadrature measurements for both forward and reflected power. These measurements are updated on a periodic interval such as 1 μs. Exemplary sensors and techniques for processing data from a sensor are disclosed in U.S. patent application Ser. No. 12/116,375, filed May 7, 2008, entitled System, Method, and Apparatus for Monitoring Power, which is incorporated herein by reference.

For each measurement interval, the complex-$\Gamma$ component 1506 calculates a load reflection coefficient ($\Gamma$) as $V_{RFL}/V_{FWD}$, which is a division of complex numbers (I is the real part of the vector and Q is the imaginary part of the vector). $\Gamma$ can also be calculated by rotating RFL with a phase that is -1 times the phase of FWD, then dividing by |FWD|. One exemplary technique that is effective for FPGA implementation was created and was implemented as follows:

1. Calculate FWDQ2+FWDI2 using FPGA multipliers, with shifts as needed to maximize utilization of significant bits.
2. Calculate K=1/(FWDQ2+FWDI2) using FPGA lookup table, with shifts as needed to maximize utilization of significant bits.
3. Using shifts as needed to maximize precision, calculate Re($\Gamma$) as $K*I_{FWD}*I_{RFL}+K*Q_{FWD}*Q_{RFL}$, and Im($\Gamma$) as $K*I_{FWD}*Q_{RFL}-K*Q_{FWD}*I_{RFL}$. This is derived from K times the complex product of $V_{RFL}$ and the conjugate of $V_{FWD}$. When multiplying two complex vectors, the resultant phase is additive. When multiplying with the conjugate, the resultant phase is subtractive.

Figure 16:
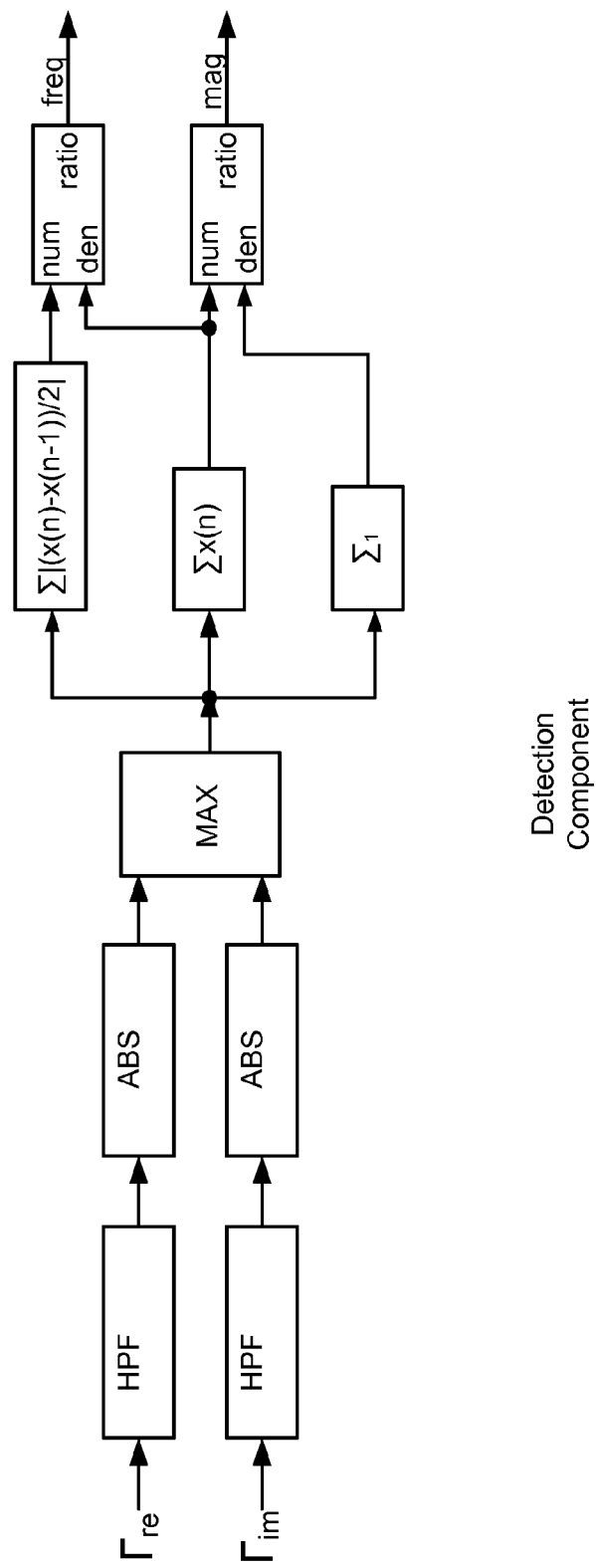
FIG. 16 is a block diagram depicting an exemplary embodiment of the detection component depicted in FIG. 15.

Referring next to FIG. 16, shown is a block diagram depicting exemplary components in the detection component 1508 depicted in FIG. 15. In general, the detection component 1508 provides an indication (depicted as an instability signal 1509) of whether an oscillation is present in the power (and hence an indication of the type of instability in the plasma). In some variations of the embodiment depicted in FIG. 15, the detection component 1508 provides the instability signal 1509 as a binary signal—indicating whether an instability is present or not.

But in other variations of the embodiment depicted in FIG. 15, detection component 1508 provides an output indicative of the frequency and magnitude of any oscillations. As discussed above, the reference frequency of the power amplifier may be utilized to reduce instabilities, and knowledge about the particular types of oscillations that are present in the output power may be utilized to align the impedance trajectories of the plasma and power amplifier as taught in the above-identified U.S. patent application Ser. No. 12/184,535.

As shown in FIG. 16, to remove any DC component, a high-pass filter is applied to both Re($\Gamma$) and Im($\Gamma$), with the output corresponding to the type of oscillation of $\Gamma$ (and the type of instability). As an example, the high-pass filter can be implemented as y(n)=1024*x(n)-x(n-1)- . . . -x(n-1024).

In one implementation, to save FPGA resources, the filtered Re($\Gamma$) and Im($\Gamma$) values are combined by selecting the maximum absolute value between the two. In alternative implementations, a design with separate frequency/magnitude detection for each parameter could also be used. Generally, the result after the max function will be a full-wave rectified sinusoid. Three calculations are applied to the signal:

1. Summation of 0.5*abs(x(n)-x(n-1)). The y(n)=x(n)-x(n-1) operation is a highpass filter with response that is somewhat linear with frequency. The response of this filter is shown below.
2. Summation of x(n). This operation provides an indication of overall energy in the signal, and is used to normalize the frequency indication. When divided by the number of samples, it is also used for the magnitude output.
3. Summation of 1. The result from this accumulator is the number of samples.

As shown, the outputs of the detection component in this particular embodiment provide an indication of both the frequency and magnitude of oscillations associated with an instability.

Figure 17A:
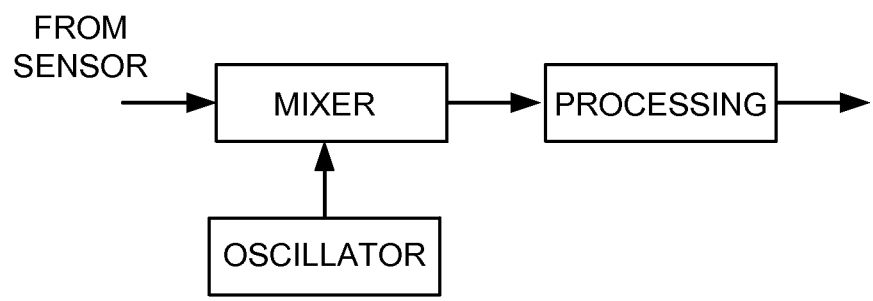
FIGS. 17A and 17B depict other exemplary embodiments of the detection component depicted in FIG. 15.
Figure 17B:
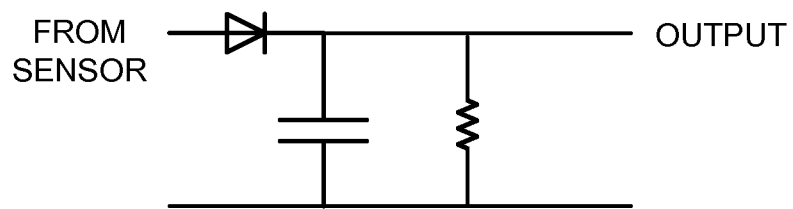

Referring to FIGS. 17A and 17B, shown are a heterodyne type and diode type detector, respectively, that may be utilized to realize the instability detector 1470 described with reference to FIG. 14. Both of the depicted detectors are well known to those of ordinary skill in the art, and in light of this specification, these types of detectors may be modified and adapted to detect particular frequencies of oscillations and provide outputs that are usable by the compensation signal-detection circuit 1460.

Figure 18:
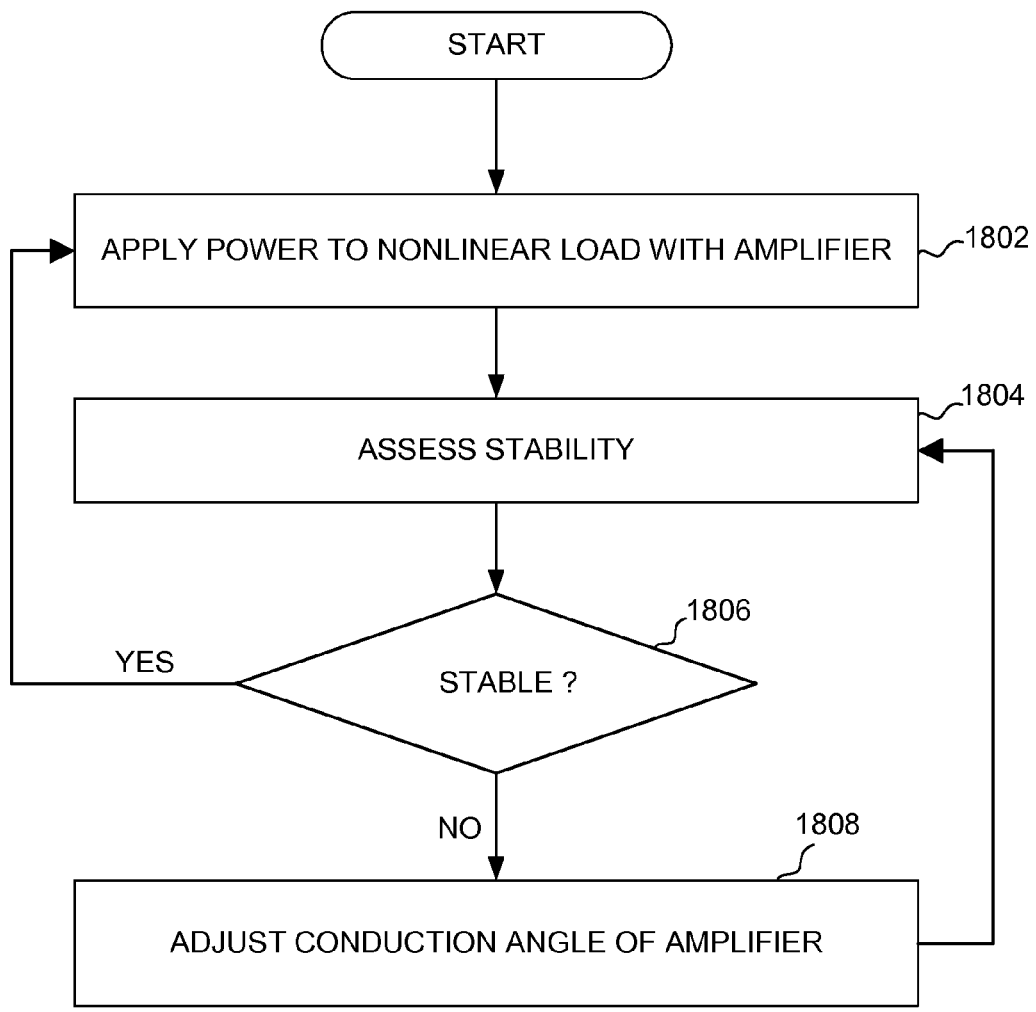
FIG. 18 is a flowchart depicting an exemplary method that may be traversed in connection with embodiments of the present invention.

Referring next to FIG. 18, shown is a flowchart depicting an exemplary method for reducing a sensitivity of a power amplifier to changes in load impedance that may be traversed in connection with the embodiments described herein. As shown, in this method when power is applied to a load (Block 1802), the stability of the output power is assessed (Block 1804). As described previously herein, the stability may be assessed by a variety of techniques including the approaches described with reference to FIGS. 16-17.

As depicted, if the power is stable (Block 1806) then power continues to be applied to the load (Block 1802) and the stability is again assessed (e.g. on a periodic basis) (Block 1804). But if the power is unstable (Block 1806), the conduction angle of the amplifier is adjusted (Block 1808) and the stability of the output power is again assessed (Block 1804), and if the output power is still unstable (Block 1806) the conduction angle of the output power is again adjusted (Block 1808). Thus consistent with the method depicted in FIG. 18, if an instability is detected, the conduction angle of the output power may be adjusted in a stepwise manner until the output power is stable. In some variations, the conduction angle is adjusted downward to reduce the on-time of switching component(s) (e.g., MOSFETS) in the power amplifier, but Applicants have found that adjustments that increase the conduction angle of the power amplifier may also be effective to render the output power stable.

Figure 19A:
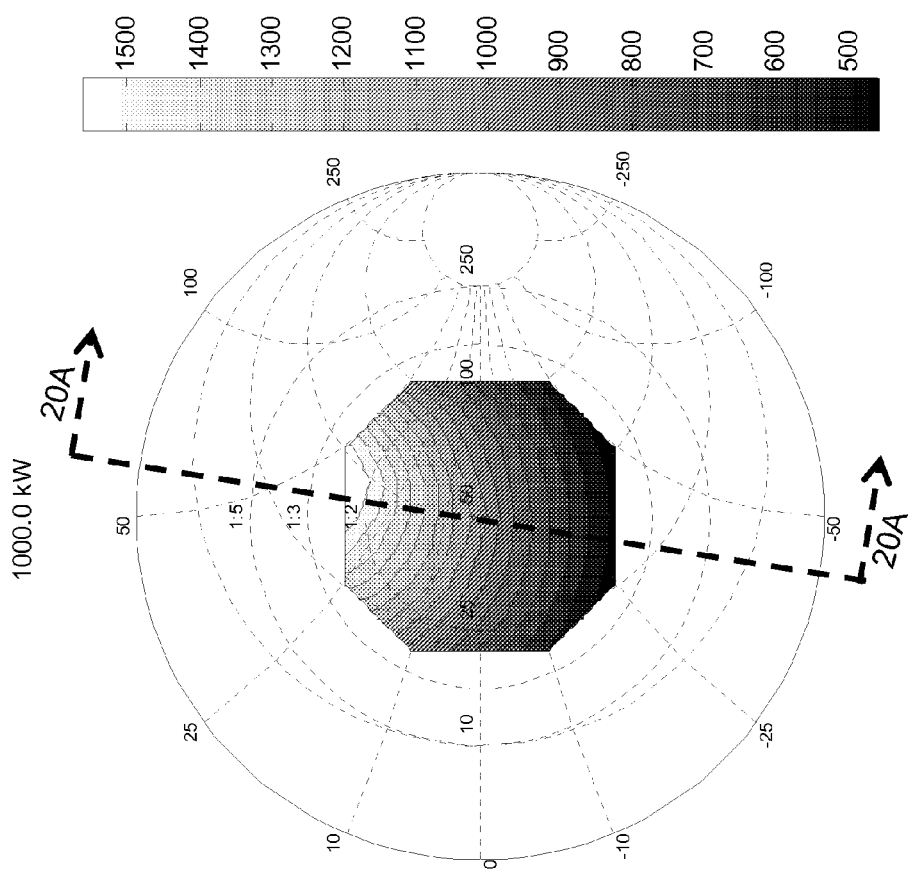
FIGS. 19A and 19B are Smith charts depicting operational characteristics of a typical generator and a generator implemented according to the present invention, respectively.
Figure 19B:
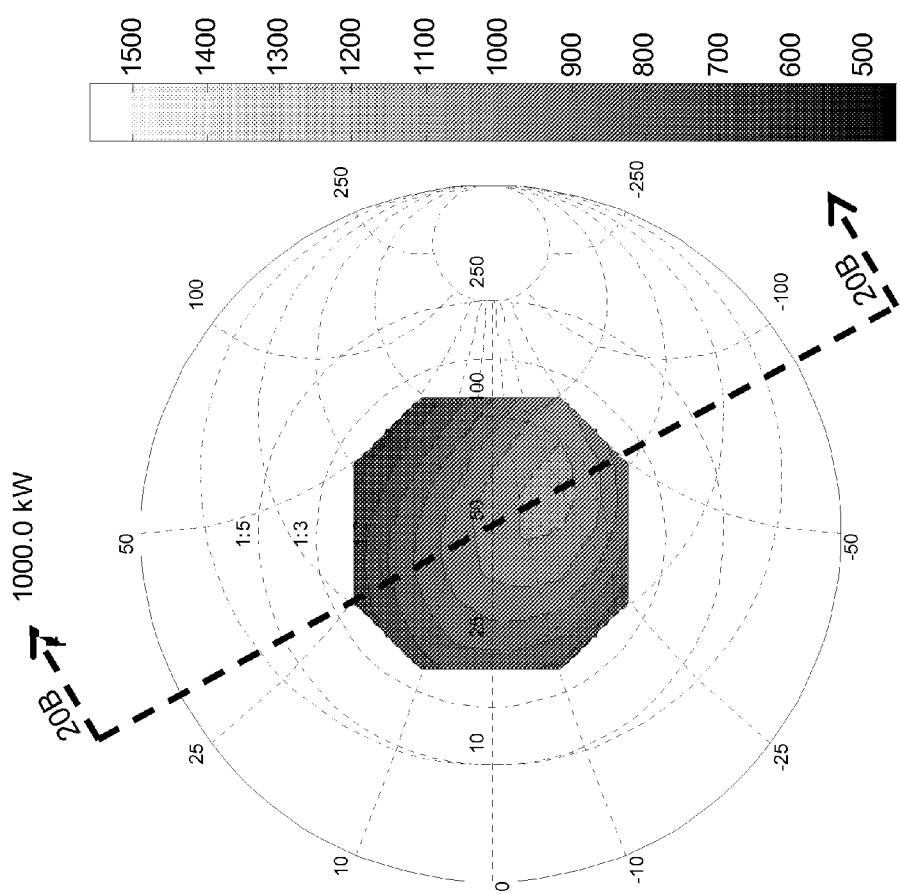

Referring to FIGS. 19A and 19B, shown are Smith charts depicting the open loop response of a generator's output power to impedance changes when operated at a first and a second conduction angle, respectively. More specifically, FIG. 19A shows the open loop response of the generator's output power in response to impedance changes with a typical high efficiency (e.g., high conduction angle) amplifier such as a class D or class E type amplifier. And FIG. 19B displays the open loop response of the generator's output power with a reduction in the conduction angle of the typical high efficiency amplifier.

As shown, the slope of the contour line that crosses 50 Ohms in FIG. 19A is approximately 1.6. This is in contrast to the slope of the analogous line in FIG. 19B, which is approximately 0.35. Thus, the sensitivity of the generator in this example is reduced by approximately 4 times when the conduction angle of the power amplifier is reduced (e.g., from 180 degrees to 150 degrees).

Figure 20B:
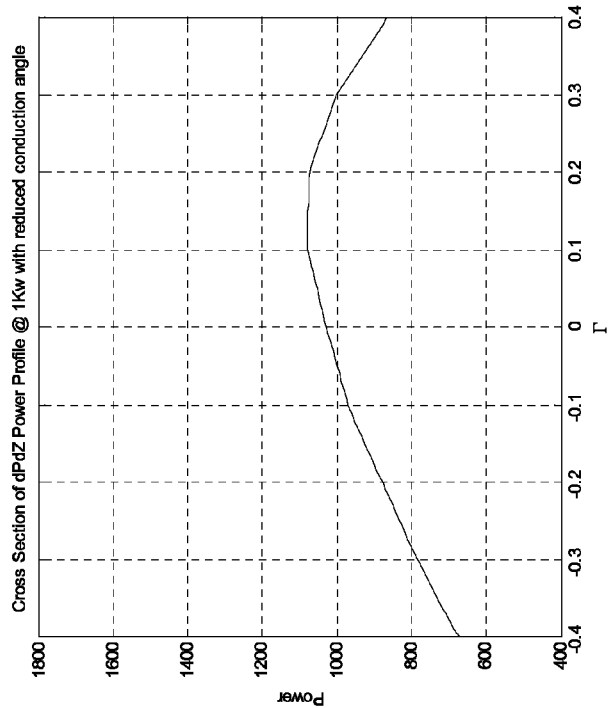
FIGS. 20A and 20B are additional graphs depicting operational characteristics of a typical generator and a generator implemented according to the present invention, respectively.
Figure 20A:
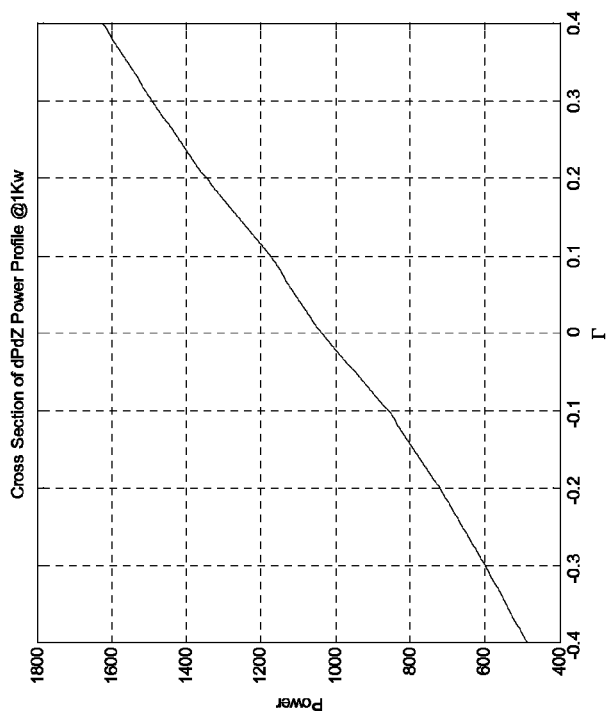

Referring to FIGS. 20A and 20B, shown are cross sectional views taken along lines 20A-20A and lines 20B-20B, respectively, of FIGS. 20A and 20B. As shown in FIG. 20A, when the generator is operating as the typical class D or class E type amplifier, any change in load impedance results in a substantial change in the output power of the generator as compared to the generator operating with a reduced amplifier conduction angle, which is depicted in FIG. 20B.

Figure 21B:
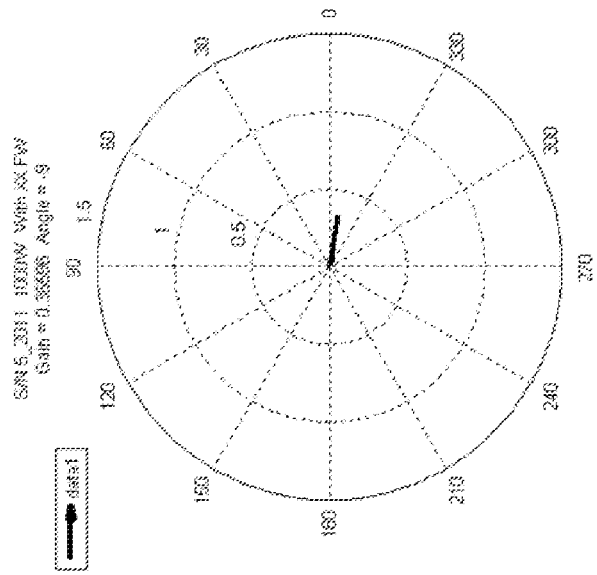
FIGS. 21A and 21B are yet additional graphs depicting stability characteristics of a typical generator and a generator implemented according to the present invention, respectively.
Figure 21A:
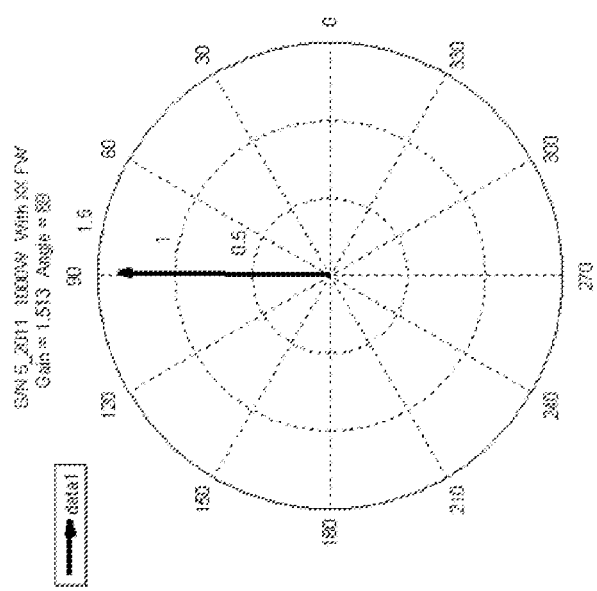

FIGS. 21A and 21B depict both a magnitude of the gain (i.e., the complex representation of $$\frac{dP}{dZ}$$

discussed with reference to Equation 1) and an angle of an exemplary generator operating at a conduction angle of 180 degrees and 150 degrees, respectively. As shown in FIGS. 21A and 21B, in addition to the gain substantially decreasing when the conduction angle is adjusted, the angle also changes when the conduction angle is decreased from 180 degrees to 150 degrees.

Referring next to FIGS. 22A and 22B, shown are graphs depicting plasma instability versus the length of a cable that applies power from a power amplifier to a load for an exemplary generator without the conduction angle adjustment functionality, and the generator adapted to include the conduction angle adjustment functionality disclosed herein, respectively. As shown, in FIG. 22A the exemplary generator is unstable over a relatively large range of cable lengths from about six to sixteen feet. And in contrast (as shown in FIG. 22B), the same generator is stable over a range of cable lengths from zero to twenty-five feet when the conduction angle is adjusted as disclosed herein.

As discussed previously herein, the conduction angle of a power amplifier may be adjusted in a variety of ways. For example, a DC bias applied to a gate of a FET of the power amplifier may be adjusted in terms of amplitude or pulse width modulation (PWM), and/or the magnitude of the reference frequency that is applied to the FET may be adjusted.

In some modes of operation, after the output power is stabilized (in response to an adjustment of the conduction angle of the amplifier), after a period of time, the conduction angle may be slowly adjusted back in the direction of the original conduction angle if the output power remains stable. For example, if the power amplifier is biased to operate with a more power efficient conduction angle, and the conduction angle is adjusted to render the output power more stable (but less efficient), the conduction angle of the amplifier may be adjusted back to a more efficient state of operation.

In some variations, the power amplifier may be initially biased to operate within a particular amplifier class (e.g., one of Class A, Class B, Class D or Class E) then adjusted across one or more other amplifier classes to render the amplifier less sensitive to variations in load impedance and more stable. Thus in some modes of operation, the power amplifier is operated as a variable-class amplifier that is adjustable based upon efficiency, dissipation, and stability considerations.

It is also contemplated that an adjustment to the conduction angle of the amplifier may be utilized in connection with adjustments to frequency of the power amplifier to render the output power more stable. For example, frequency adjustments may be initially attempted to render the output power stable, and if the frequency adjustments are ineffective, then adjustments to the conduction angle may be made. Alternatively, adjustments to the conduction angle may be initially made, and if the conduction angle adjustments are not sufficient to render the output power stable, then frequency adjustments may be made.

In conclusion, the present invention provides, among other things, a method and apparatus for modifying interactions between an electrical generator and a nonlinear load. Those skilled in the art can readily recognize that numerous variations and substitutions may be made in the invention, its use, and its configuration to achieve substantially the same results as achieved by the embodiments described herein. Accordingly, there is no intention to limit the invention to the disclosed exemplary forms. Many variations, modifications, and alternative constructions fall within the scope and spirit of the disclosed invention as expressed in the claims.

What is claimed is:

1. A generator comprising:
   a power amplifier configured to apply output power to a load responsive to a power control signal and a reference signal;
   a power control system coupled to the power amplifier, the power control system adjusts the power control signal based upon a power set point and the output power; and
   a compensation subsystem coupled to the power amplifier, the compensation subsystem controlling a conduction angle of the power amplifier to enable a sensitivity of the power amplifier, to variations in an impedance of the load, to be adjusted.

2. The generator of claim 1, wherein the compensation subsystem includes an operator interface to enable an operator of the generator to control the sensitivity of the power amplifier.

3. The generator of claim 1, wherein the compensation subsystem includes an instability detector configured to provide an indication of an instability in the output power, wherein the compensation subsystem is configured to control the conduction angle of the power amplifier based upon the indication of the instability.

4. The generator of claim 3, wherein the compensation subsystem is configured to adjust the conduction angle of the power amplifier in a step-wise fashion until the instability in the output power is reduced to a tolerable level.

5. The generator of claim 1, wherein the compensation subsystem is configured to control a conduction angle of the power amplifier based upon an impedance of the load.

6. The generator of claim 1, wherein the power amplifier is normally biased to operate within a particular class of power amplifiers and the compensation subsystem controls the conduction angle of the power amplifier to enable the power amplifier to operate within at least one other class of power amplifiers to adjust the sensitivity of the power amplifier.

7. The generator of claim 1, wherein the conduction angle of the power amplifier is controlled by adjusting a signal that is applied to a gate of a switching component of the power amplifier.

8. The generator of claim 7, wherein the signal that is applied to the gate is adjusted by controlling a DC bias that is applied to the gate.

9. The generator of claim 8, wherein the DC bias is controlled by pulse-width-modulating the DC bias.

10. The generator of claim 8, wherein a magnitude of the DC bias is controlled.

11. The generator of claim 7, wherein the signal that is applied to the gate is adjusted by controlling a magnitude of a reference signal that is applied to the gate.

12. A method for reducing a sensitivity of a generator to variations in impedance of a load, the method comprising:
applying output power to the load using a power amplifier;
controlling a level of the output power responsive to a power control setting; and
adjusting a conduction angle of the power amplifier to reduce a level of sensitivity of the power amplifier to variations of an impedance of the load.

13. The method of claim 12 including:
detecting an instability in the output power; and
adjusting the conduction angle of the power amplifier responsive to the instability.

14. The method of claim 13, wherein adjusting includes adjusting the conduction angle by a series of discrete adjustments until the instability is below a threshold.

15. The method of claim 12, including:
measuring an impedance of the load; and
adjusting the conduction angle of the power amplifier responsive to the measured impedance.

16. The method of claim 12, wherein adjusting the conduction angle includes adjusting a signal to a gate of the of a field effect transistor of the power amplifier.

17. The method of claim 16 including adjusting a parameter of the signal, the parameter selected from the group consisting of a magnitude, a pulse width, and a frequency of the signal.

18. A generator comprising:
means for applying output power to the load using a power amplifier;
means for controlling a level of the output power responsive to a power control setting; and
means for adjusting a conduction angle of the power amplifier to reduce a level of sensitivity of the power amplifier to variations of an impedance of the load.

19. The generator of claim 18 including:
means for detecting an instability in the output power; and
means for adjusting the conduction angle of the power amplifier responsive to the instability.

20. The generator of claim 19, wherein means for adjusting includes means for adjusting the conduction angle by a series of discrete adjustments until the instability is below a threshold.

21. The generator of claim 18, including:
means for measuring an impedance of the load; and
means for adjusting the conduction angle of the power amplifier responsive to the measured impedance.

22. The generator of claim 18, wherein means for adjusting the conduction angle includes means for adjusting a signal to a gate of the of a field effect transistor of the power amplifier.

23. The generator of claim 22 including means for adjusting a parameter of the signal, the parameter selected from the group consisting of a magnitude, a pulse width, and a frequency of the signal.

24. A generator, comprising:
at least two control inputs wherein at least one of the at least two control inputs is used to modify a sensitivity of the generator to an impedance of a load and at least one of the at least two control inputs is used to control an output power of the generator so that a same level of power can be delivered to the load with different combinations of levels of the at least two control inputs, and a combination of control inputs that produces a desired level of power and an acceptable sensitivity to the impedance of the load may be utilized.

25. The generator of claim 24, wherein a first of the at least two control inputs controls a rail voltage and a second of the at least two control inputs controls a conduction angle of an amplifier of the generator.

* * * * *